(12) United States Patent
Ali et al.

(10) Patent No.: US 8,409,790 B2
(45) Date of Patent: Apr. 2, 2013

(54) METHOD OF PRODUCING A RELIEF IMAGE FOR PRINTING

(75) Inventors: M. Zaki Ali, Mendota Heights, MN (US); David E. Brown, St. Paul, MN (US); Elsie A. Fohrenkamm, St. Paul, MN (US); Michael B. Heller, Inver Grove Heights, MN (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/314,218

(22) Filed: Dec. 8, 2011

(65) Prior Publication Data

US 2012/0135354 A1  May 31, 2012

Related U.S. Application Data

(62) Division of application No. 11/081,018, filed on Mar. 15, 2005, now Pat. No. 8,142,987.

(60) Provisional application No. 60/561,162, filed on Apr. 10, 2004, provisional application No. 60/630,460, filed on Nov. 23, 2004.

(51) Int. Cl.
*G03F 7/26* (2006.01)

(52) U.S. Cl. .......................... 430/325; 430/14; 430/306

(58) Field of Classification Search .............. 430/306, 430/14, 325
See application file for complete search history.

(56) References Cited

U.S. PATENT DOCUMENTS

| | | | |
|---|---|---|---|
| RE24,906 E | 12/1960 | Ulrich | |
| 3,458,311 A | 7/1969 | Alles | |
| 3,769,019 A | 10/1973 | Wiese, Jr. et al. | |
| 3,794,494 A | 2/1974 | Kai et al. | |
| 3,796,602 A | 3/1974 | Briney et al. | |
| 4,045,231 A | 8/1977 | Toda et al. | |
| 4,081,278 A | 3/1978 | Dedinas et al. | |
| 4,177,074 A | 12/1979 | Proskow | |
| 4,293,635 A | 10/1981 | Flint et al. | |
| 4,323,636 A | 4/1982 | Chen | |
| 4,323,637 A | 4/1982 | Chen et al. | |
| 4,361,640 A | 11/1982 | Pine | |
| 4,400,459 A | 8/1983 | Gruetzmacher et al. | |
| 4,400,460 A | 8/1983 | Fickes et al. | |
| 4,427,759 A | 1/1984 | Gruetzmacher et al. | |
| 4,429,027 A | 1/1984 | Chambers, Jr. et al. | |
| 4,430,417 A | 2/1984 | Heinz et al. | |
| 4,431,723 A | 2/1984 | Proskow | |
| 4,442,302 A | 4/1984 | Pohl | |
| 4,460,675 A | 7/1984 | Gruetzmacher | |
| 4,517,279 A | 5/1985 | Worns | |
| 4,726,877 A | 2/1988 | Fryd et al. | |
| 4,753,865 A | 6/1988 | Fryd et al. | |
| 4,876,235 A | 10/1989 | DeBoer | |
| 4,894,315 A | 1/1990 | Feinberg et al. | |
| 4,956,252 A | 9/1990 | Fryd et al. | |
| 5,126,760 A | 6/1992 | DeBoer | |
| 5,171,650 A | 12/1992 | Ellis et al. | |
| 5,175,072 A | 12/1992 | Martens | |
| 5,238,778 A | 8/1993 | Hirai et al. | |
| 5,248,583 A | 9/1993 | Lundquist et al. | |
| 5,262,275 A | 11/1993 | Fan | |
| 5,278,023 A | 1/1994 | Bills et al. | |
| 5,330,962 A | 7/1994 | De Braabandere et al. | |
| 5,354,645 A | 10/1994 | Schober et al. | |
| 5,380,644 A | 1/1995 | Yonkoski et al. | |
| 5,399,459 A | 3/1995 | Simpson et al. | |
| 5,468,591 A | 11/1995 | Pearce et al. | |
| 5,510,228 A | 4/1996 | Neumann et al. | |
| 5,521,050 A | 5/1996 | Henzel et al. | |
| 5,521,051 A | 5/1996 | Neumann et al. | |
| 5,576,141 A | 11/1996 | Neumann et al. | |
| 5,576,142 A | 11/1996 | Neumann et al. | |
| 5,576,144 A | 11/1996 | Pearce et al. | |
| 5,705,310 A | 1/1998 | Van Zoeren | |
| 5,719,009 A | 2/1998 | Fan | |
| 5,819,661 A | 10/1998 | Lewis et al. | |
| 5,935,758 A | 8/1999 | Patel et al. | |
| 5,994,026 A | 11/1999 | DeBoer et al. | |
| 6,001,530 A | 12/1999 | Kidnie et al. | |
| 6,013,409 A | 1/2000 | Chou | |
| 6,020,108 A | 2/2000 | Goffing et al. | |
| 6,027,849 A | 2/2000 | Vogel | |
| 6,037,102 A | 3/2000 | Loerzer et al. | |
| 6,369,844 B1 | 4/2002 | Neumann et al. | |
| 6,521,390 B1 | 2/2003 | Leinenbach et al. | |
| 6,599,679 B2 | 7/2003 | Philipp et al. | |
| 6,664,020 B1 | 12/2003 | Warner et al. | |
| 6,713,241 B2 | 3/2004 | Vaeth et al. | |
| 2001/0026309 A1 | 10/2001 | Takeyama | |
| 2002/0115014 A1 | 8/2002 | Johnson et al. | ............... 430/167 |
| 2004/0048199 A1 | 3/2004 | Schadebrodt et al. | |

FOREIGN PATENT DOCUMENTS

| | | |
|---|---|---|
| DE | 28 23 300 | 12/1979 |
| DE | 38 28 551 | 3/1990 |
| EP | 0 602 893 | 6/1994 |
| EP | 0 739 748 | 10/1996 |
| JP | 11-184062 | 7/1999 |
| WO | WO 90/12342 | 10/1990 |
| WO | WO 94/04368 | 3/1994 |

*Primary Examiner* — Daborah Chacko Davis
(74) *Attorney, Agent, or Firm* — J. Lanny Tucker

(57) ABSTRACT

The present invention involves a method for making a relief image. A film that includes a carrier sheet and an imageable material is used to form a mask image that is opaque to a curing radiation. In one embodiment, the mask image is formed on the carrier sheet while in another embodiment, the mask image is formed on a receptor sheet. The mask image is then transferred to a photosensitive material, such as a flexographic printing plate precursor. The resulting assembly is exposed to the curing radiation resulting in exposed and unexposed areas of the photosensitive material. The carrier sheet or the receptor sheet may be removed from the mask image either before or after exposure to the curing radiation. Finally, the photosensitive material and mask image assembly is developed with a suitable developer to form a relief image.

23 Claims, 13 Drawing Sheets

METHOD OF PRODUCING A RELIEF IMAGE FOR PRINTING

CROSS-REFERENCE TO RELATED APPLICATIONS

This application is a divisional and claims the benefit of U.S. application Ser. No. 11/081,018, titled "Method of Producing a Relief Image for Printing" filed Mar. 15, 2005 now U.S. Pat. No. 8,142,987, and claims the benefit of Provisional Application Ser. No. 60/561,162, titled "Method of Producing a Relief Image for Printing" filed Apr. 10, 2004 and claims the benefit of Provisional Application 60/630,460, also titled "Method of Producing a Relief Image for Printing" filed Nov. 23, 2004, each of which are hereby incorporated by reference.

BACKGROUND

This invention is directed to methods of making an article bearing a relief image by forming a mask image from a film, transferring the mask image to a photosensitive material, and exposing the photosensitive material to a curing radiation. Photosensitive elements comprising a laser-ablatable mask layer on the surface of a photosensitive element have been reported. Such elements may be made into articles bearing a relief image without the use of a digital image negative or other separate masking device. The photosensitive elements having an ablatable mask layer (or a so-called "integral mask") can be imaged by first imagewise exposing the photosensitive element with laser radiation (generally from an infrared laser under computer control) to selectively remove the mask layer in the exposed areas, and then overall exposing with an actinic radiation to cure the photosensitive layer in the unmasked areas. The remaining areas of the mask layer and the non-hardened portions of the photosensitive layer are then removed by one or more liquid development processes. Examples of flexographic articles having an ablatable mask layer are described in U.S. Pat. No. 5,262,275 to Fan, U.S. Pat. No. 5,705,310 to Van Zoeren, U.S. Pat. No. 5,719,009 to Fan, U.S. Pat. No. 6,020,108 to Goffing, et al., and U.S. Pat. No. 6,037,102 to Loerzer, et al.

While elements having a laser-ablatable mask layer allow direct imagewise exposure with a laser and do not require a separate masking device, the imaging time to create the mask is very long since the sensitivity to infrared radiation is low for the known integral mask systems. Sensitivity is generally not lower than about 1 $J/cm^2$, and typically about 3 $J/cm^2$ is required for laser-ablation imaging.

In recent years attempts have been made, such as reported in U.S. Pat. No. 6,521,390 to Leinenbach, et al., to improve the infrared sensitivity of an ablatable mask layer by using heat-combustible polymeric binders and specific aliphatic diesters. Although higher sensitivity and, as such, shorter exposure time may be achieved, this construction suffers from undesirable adhesion of the ablatable mask layer to a coversheet that must be removed before exposure; see U.S. Pat. No. 6,599,679 to Philipp, et al. at C1 and C2, Table 2.

Higher sensitivity is difficult with the integral-mask construction as the laser-ablatable layer must satisfy a number of widely varying quality criteria; see U.S. Pat. No. 6,599,679, col. 2, line 1-29. The use of a polyether-polyurethane binder in an ablatable layer is reported in U.S. Pat. No. 6,599,679, but the enhancement in imaging speed was modest (Examples 1-3 reported at Table 2; cf. Comparative Example C6).

Furthermore, the integral-mask approach for the production of flexographic printing plates requires the use of high-powered laser-equipped imagers specifically configured for imaging the flexographic articles, such as CYREL Digital Imager (CDI SPARK) manufactured by Esko-Graphics (Kennesaw, Ga.), and ThermoFlex by Creo (Burnaby, British Columbia). Because of the need for varying the thicknesses of a flexographic plates depending upon the specific printing application, more than one imager may be required with the integral-mask approach.

In contrast, conventional imaging apparatus for "computer-to-plate" lithographic applications (e.g., TRENDSETTER from Creo), and digital proofing applications (e.g., DESERTCAT 88 from ECRM) may be used in the present invention that use the film to make a mask image.

SUMMARY OF THE INVENTION

In one embodiment, the method includes the steps of providing a film that includes an imageable material disposed on a carrier sheet; forming a mask image on the carrier sheet by producing exposed and non-exposed areas of the imageable material; transferring the mask image to a photosensitive material that is sensitive to a curing radiation such that the imageable material adheres more to the photosensitive material than to the carrier sheet; exposing the photosensitive material to the curing radiation through the mask image to form an imaged article, wherein the mask image is substantially opaque to the curing radiation; and developing the imaged article to form the relief image.

In another embodiment, the mask image is formed on the receptor sheet, rather than on the carrier sheet. In this embodiment, the method includes the steps of contacting the imageable material of the film with a receptor sheet so that the mask image is formed on the receptor sheet by transferring exposed areas of the imageable material to the receptor sheet and removing the carrier sheet from the mask image. Following these steps, the mask image is transferred to a photosensitive material, exposed to the curing radiation and developed to form a relief image.

In still another embodiment, the method includes the steps of forming a mask image on a carrier sheet by producing exposed and non-exposed areas of a film; transferring the mask image to a photosensitive material that is sensitive to a curing radiation such that the imageable material adheres more to the photosensitive material than to the carrier sheet; exposing the photosensitive material to the curing radiation through the mask image to form an imaged article, wherein the mask image is substantially opaque to the curing radiation; and developing the imaged article to form the relief image.

In yet another embodiment, a mask image is formed on the carrier sheet by producing exposed and non-exposed areas of the imageable material and is then transferring to a photosensitive material that is sensitive to a curing radiation. In this embodiment, the carrier sheet is removed from the mask image before the step of exposing the photosensitive material to the curing radiation.

In another embodiment, the method includes forming a mask image, from a film that includes a carrier sheet, a release layer disposed on the carrier sheet and an imageable material disposed on the release layer. In this embodiment, the imageable material includes a thermally adhesive binder. The mask image is then transferred to a photosensitive material such that the mask image is more adhesive to the photosensitive material than to the carrier sheet. Following transfer, the photosensitive material is exposed to the curing radiation through the carrier sheet and the mask image to form an imaged article. This exposure step is performed without vacuum pressure. Finally, the carrier sheet from the mask image and the mask image and the imaged article are developed to form the relief image.

Issues related to handling, mounting, and spinning in drum-based imaging systems of thick flexographic articles (with associated tendency for cracking, fingerprinting, etc.) may be avoided by using the method of the present invention. For example, if the photosensitive material is a thick flexographic article, the flexographic article may be cured while remaining substantially flat after the mask image is transferred to the flexographic article.

Yet another advantage of the invention is that the mask image may be examined prior to transferring the mask image to the photosensitive material. This permits the mask image to be "proofed" and corrected before a relief image is produced. Since the photosensitive material is typically much more expensive than the film used for making the mask image, cost savings can be realized in the production of flexographic printing plates.

The method of the present invention is advantageous as compared to imageable articles with "integral masks". For example, the mask image may be made from a film in significantly less time than when an integral-mask article is imaged, due to much greater imaging sensitivity. In some embodiments, for example, only about 0.5 J/cm$^2$ is required for mask imaging, resulting in greatly increased throughput.

A transferable mask provides flexibility in production, since a transferable mask can be used in combination with a variety of photosensitive materials and can therefore be used in a variety of applications. A transferable mask can also be used in combination with commercially available photosensitive materials on an as-needed basis. In contrast, integral-mask articles must be used with the underlying flexographic substrate, and so must be specifically manufactured for the desired application.

(1A) digitally creating a mask image from a film comprising a carrier sheet and a layer of imageable material;

(1B) laminating the mask image onto a flexographic precursor comprising a photosensitive layer and separation layer on a substrate;

(1C) removing the carrier sheet from the mask image;

(1D) exposing the flexographic precursor to curing radiation; and (1E) developing the flexographic precursor to provide a flexographic printing plate bearing a relief image.

Figure 2:
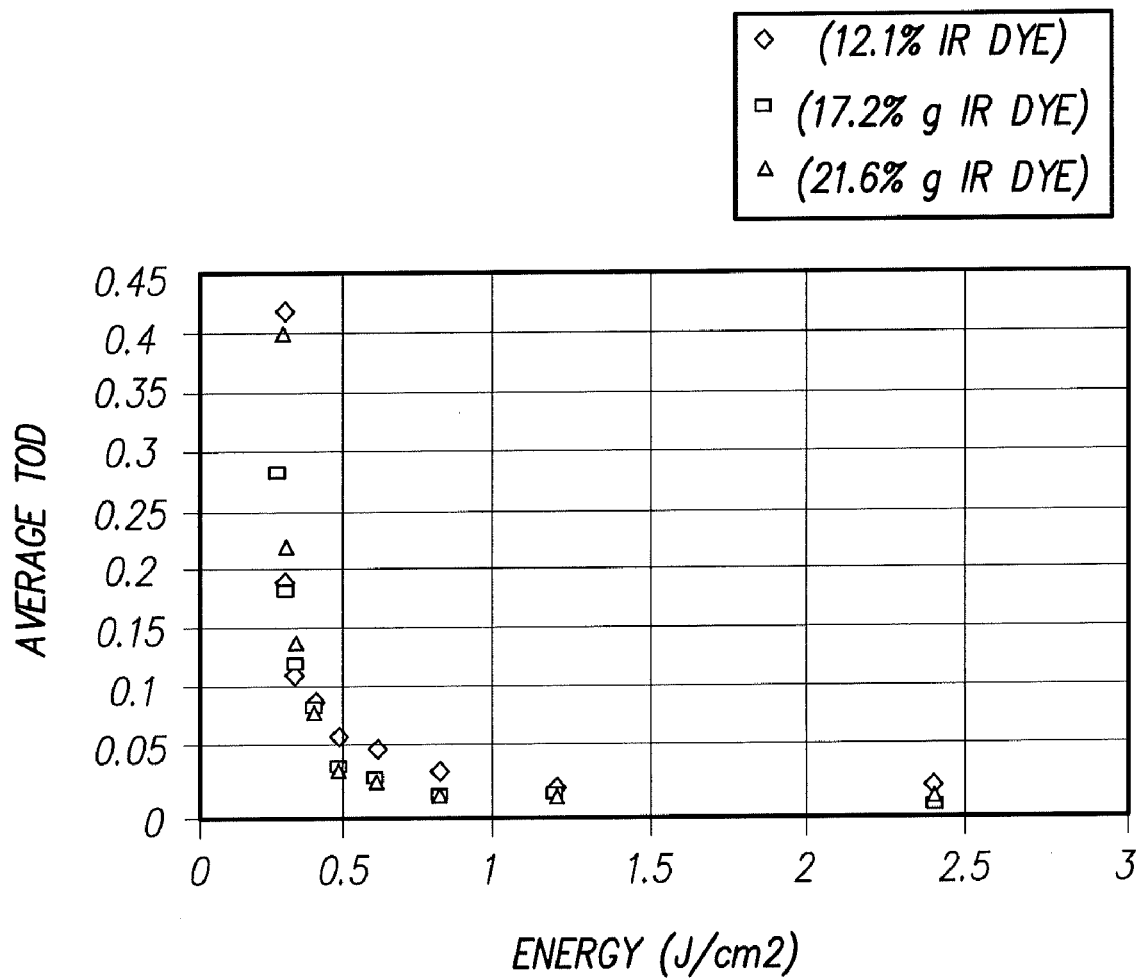

FIG. 2 illustrates the reduced imaging energy requirement attained by forming a mask image according to the invention. "TOD" refers to the transmission optical density (for ultra-violet radiation) of the exposed areas of a film. Only about 0.5-0.7 J/cm$^2$ is required to achieve sufficient transparency for effective masking.

FIGS. 3A-3E schematically illustrate a method of the invention that includes:

(3A) digitally creating a mask image from a film comprising a carrier sheet and a layer of imageable material;

(3B) laminating the mask image onto a flexographic precursor comprising a photosensitive layer and separation layer on a substrate;

(3C) exposing the flexographic precursor to curing radiation;

(3D) removing the carrier sheet from the mask image; and (3E) developing the flexographic precursor and mask image to provide a flexographic printing plate bearing a relief image.

Figure 4A:
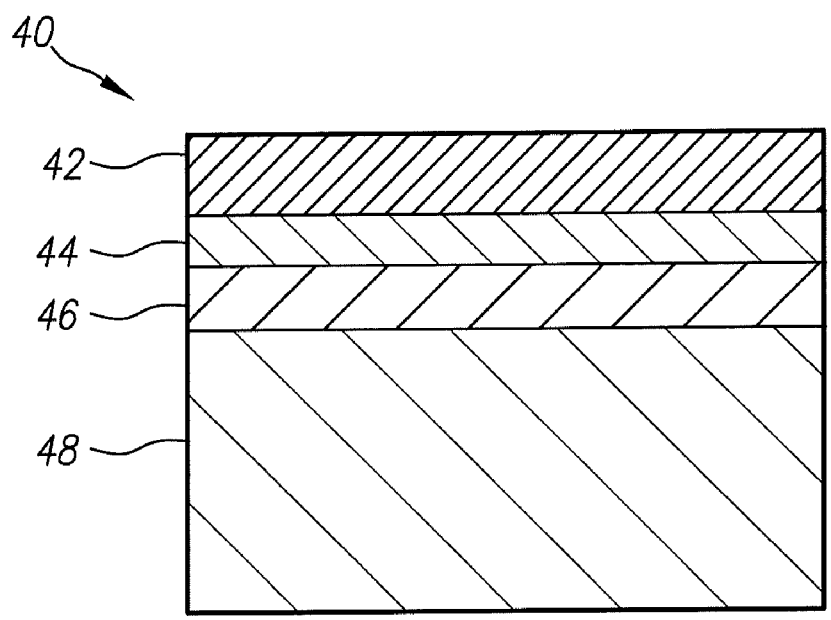

FIG. 4A illustrates a cross-sectional view of one embodiment of the film that includes a carrier sheet, a release layer, a barrier layer and an imageable material.

Figure 4B:
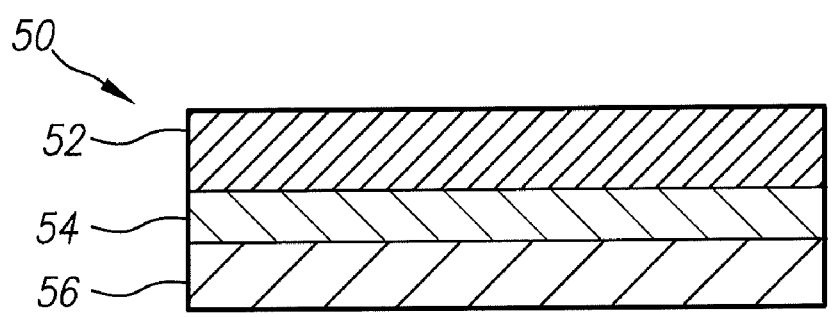

FIG. 4B illustrates a cross-sectional view of one embodiment of a photosensitive material disposed on a substrate prior to transfer of the mask image to the photosensitive material.

Figure 5A:
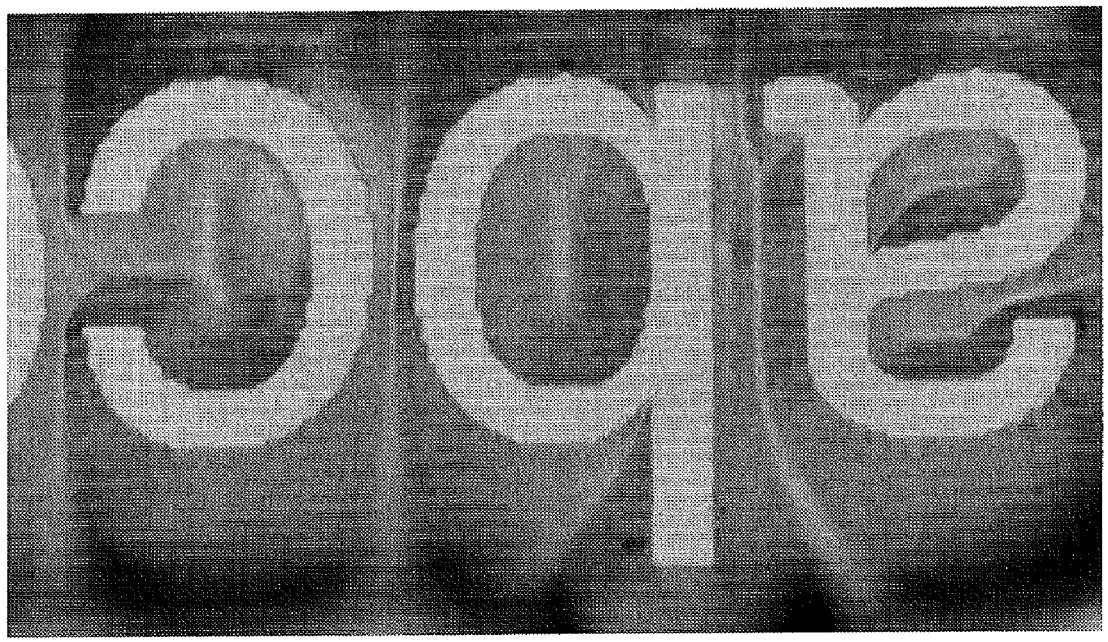

FIG. 5A illustrates an image of the type produced by the flexographic plate formed in Example 1.

Figure 5B:
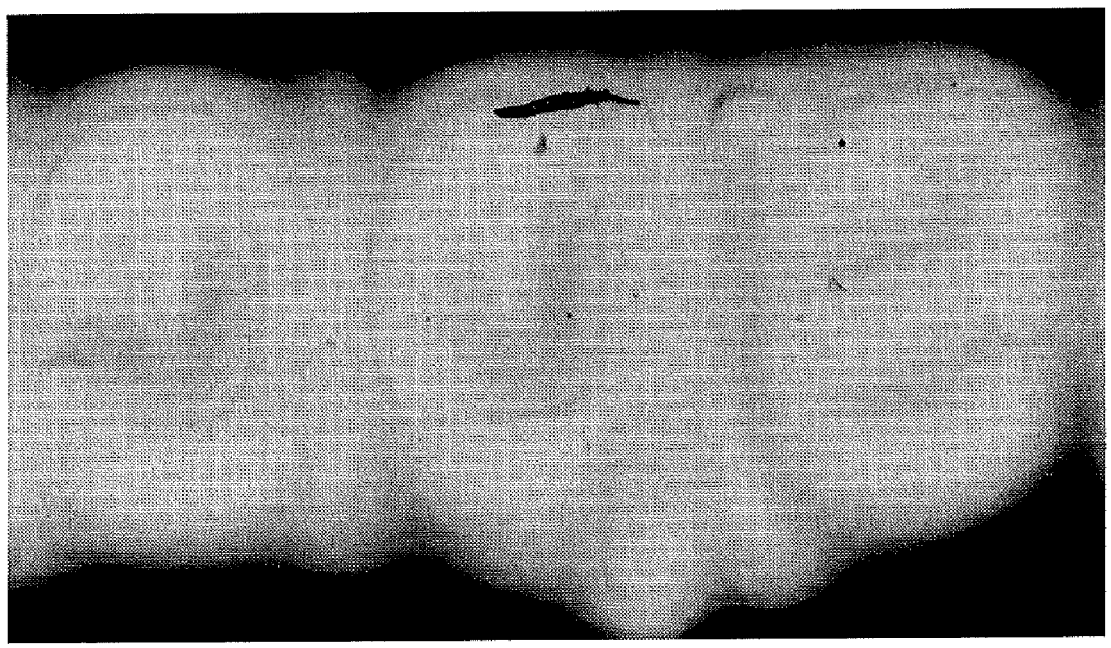

FIG. 5B illustrates an image of the type produced by the flexographic plate formed in Example 2.

Figure 6A:
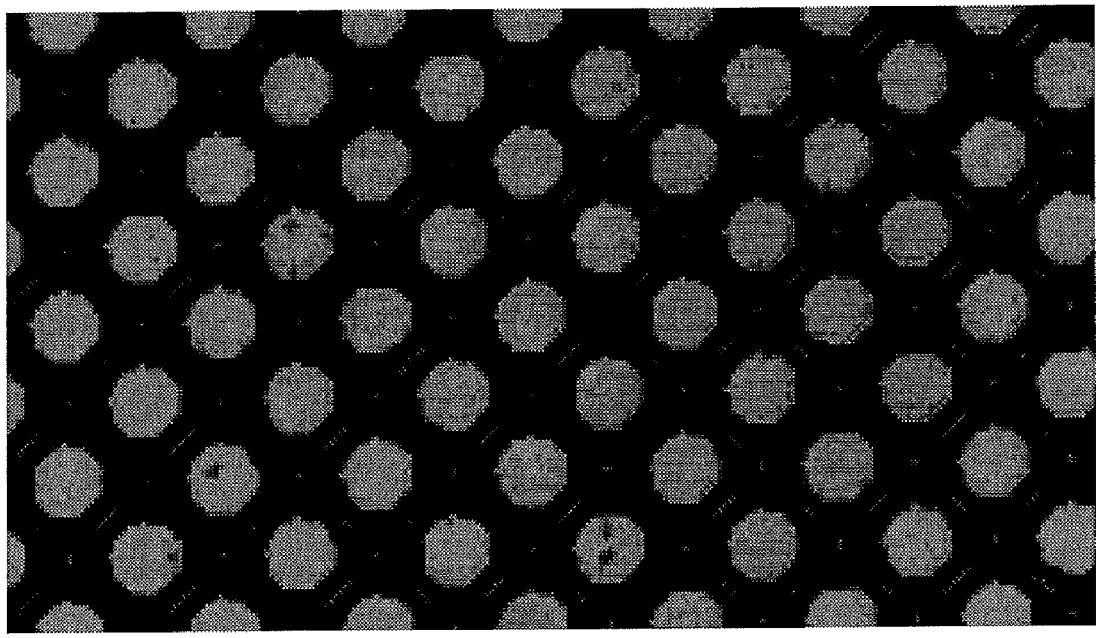

FIG. 6A illustrates an image of the 30% dots produced by the flexographic plate formed in Example 1.

Figure 6B:
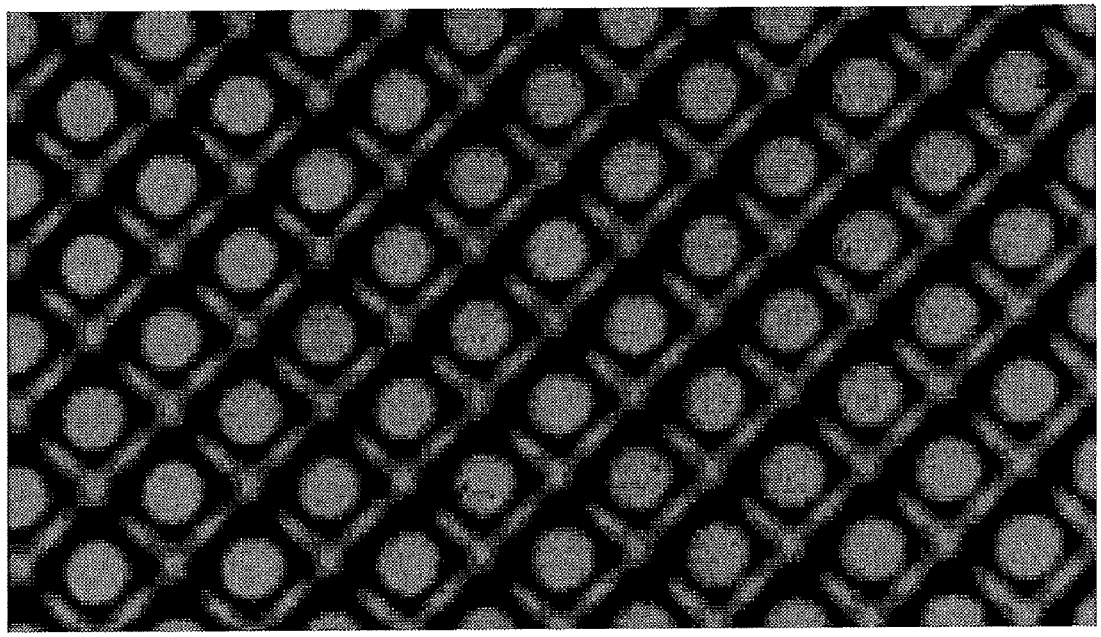

FIG. 6B illustrates an image of the 30% dots produced by the flexographic plate formed in Example 2.

Figure 7A:
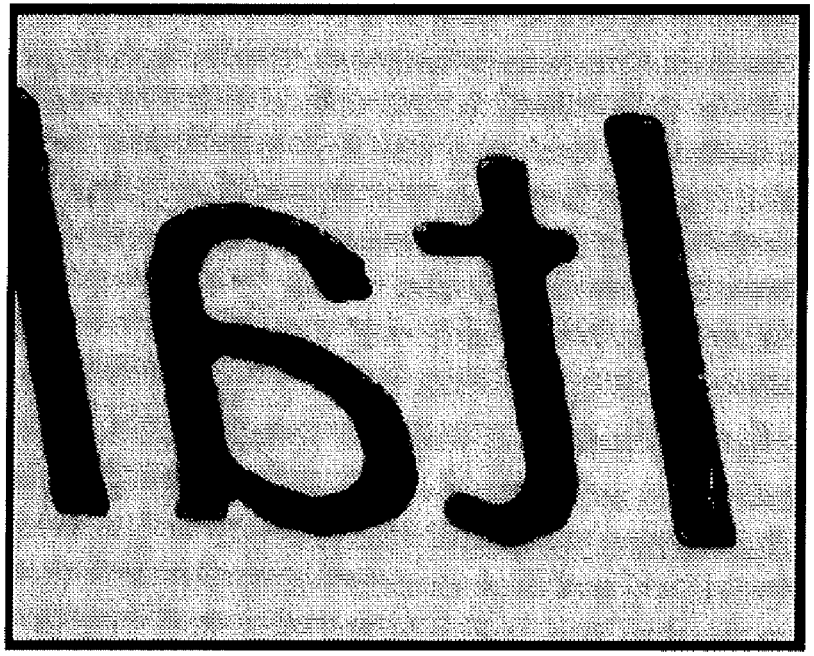

FIG. 7A illustrates four-point Helvetica type printed by a flexographic plate produced with the method of the present invention.

Figure 7B:

FIG. 7B illustrates four-point Helvetica type printed by a flexographic plate produced with a known flexographic plate with an integral mask.

Figure 8A:
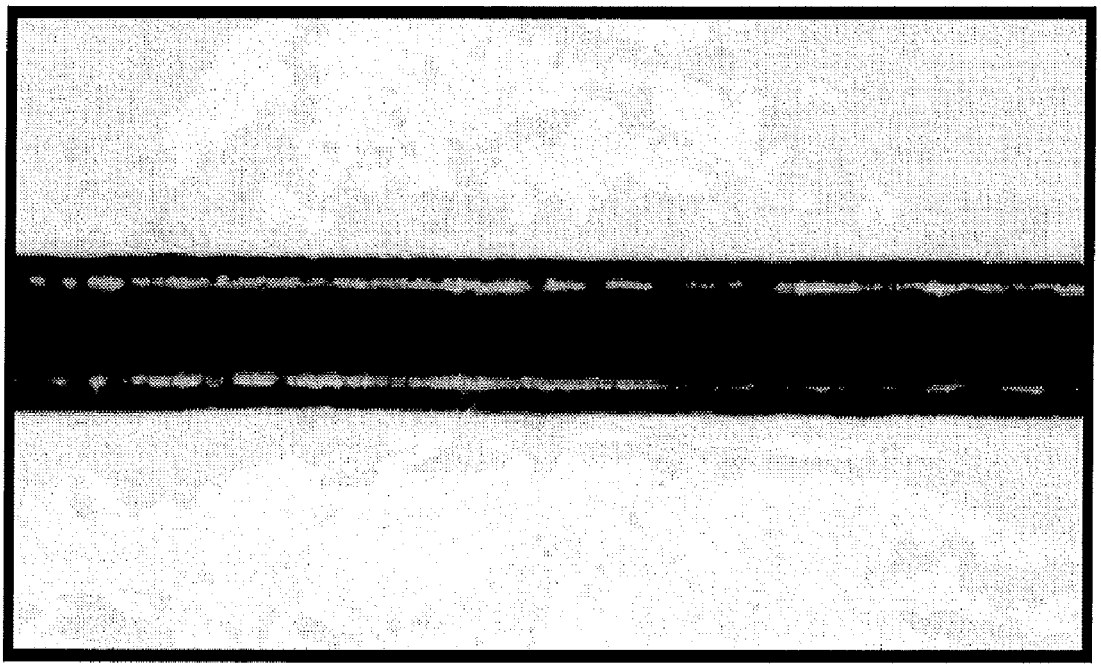

FIG. 8A illustrates 80 micrometer fine line printed by a flexographic plate produced with the method of the present invention.

Figure 8B:
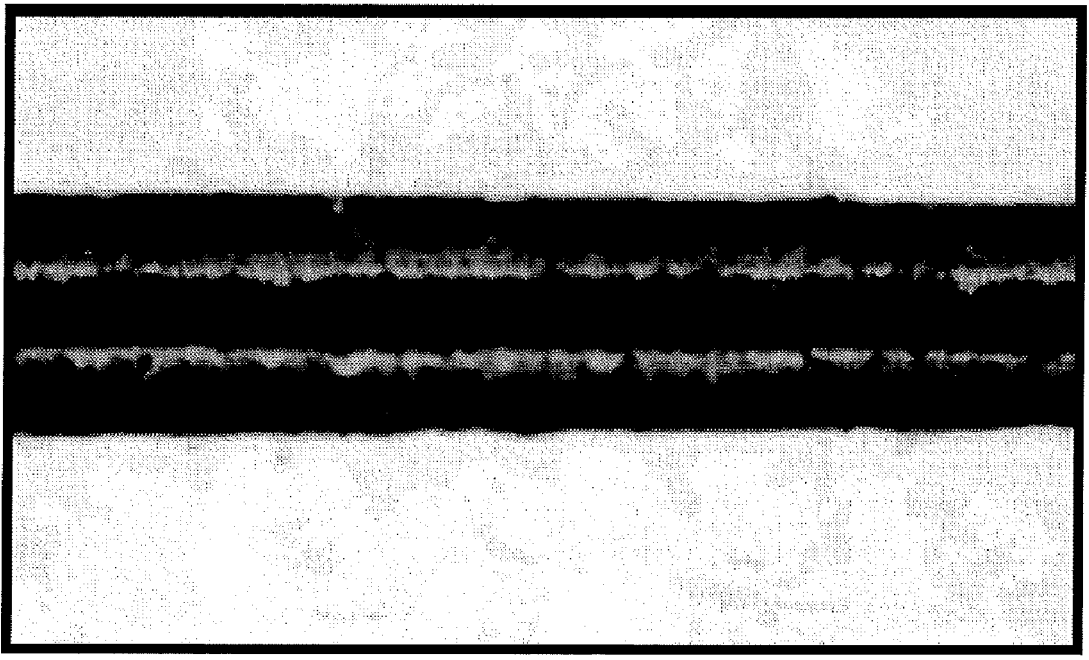

FIG. 8B illustrates 80 micrometer fine line printed by a flexographic plate produced with a known flexographic plate with an integral mask.

Figure 9A:
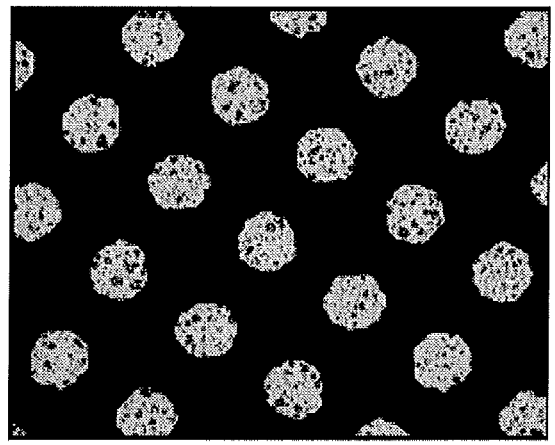

FIG. 9A illustrates 25% dots in a 150 lpi Silver Halide mask (88% to 90% UV-A transmission).

Figure 9B:
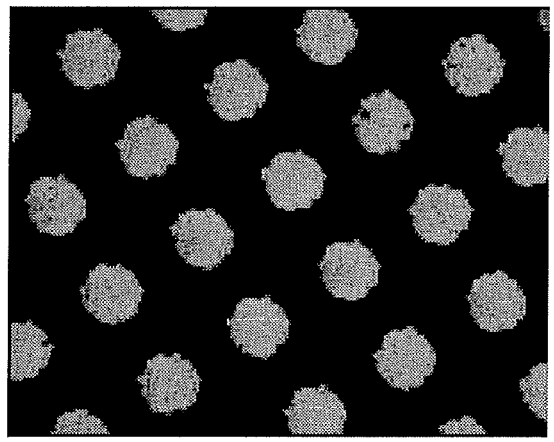

FIG. 9B illustrates 25% dots in a 150 lpi integral mask (73% to 78% UV-A transmission).

Figure 9C:
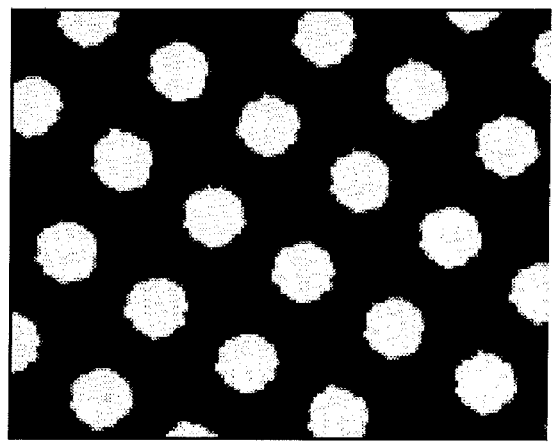

FIG. 9C illustrates 25% dots in a 150 lpi transfer mask (95% to 98% UV-A transmission).

Figure 10A:
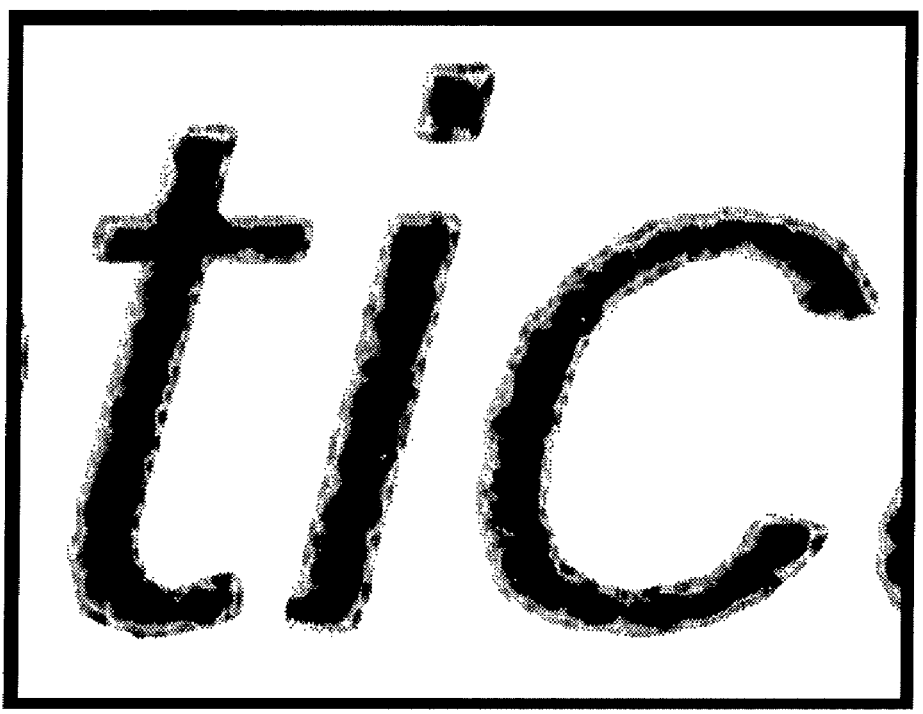

FIG. 10A illustrates an image of 4-point type produced in the flexographic plate of Example 7.

Figure 10B:

FIG. 10B illustrates an image of 4-point type produced in the flexographic plate of Example 8.

Figure 11A:
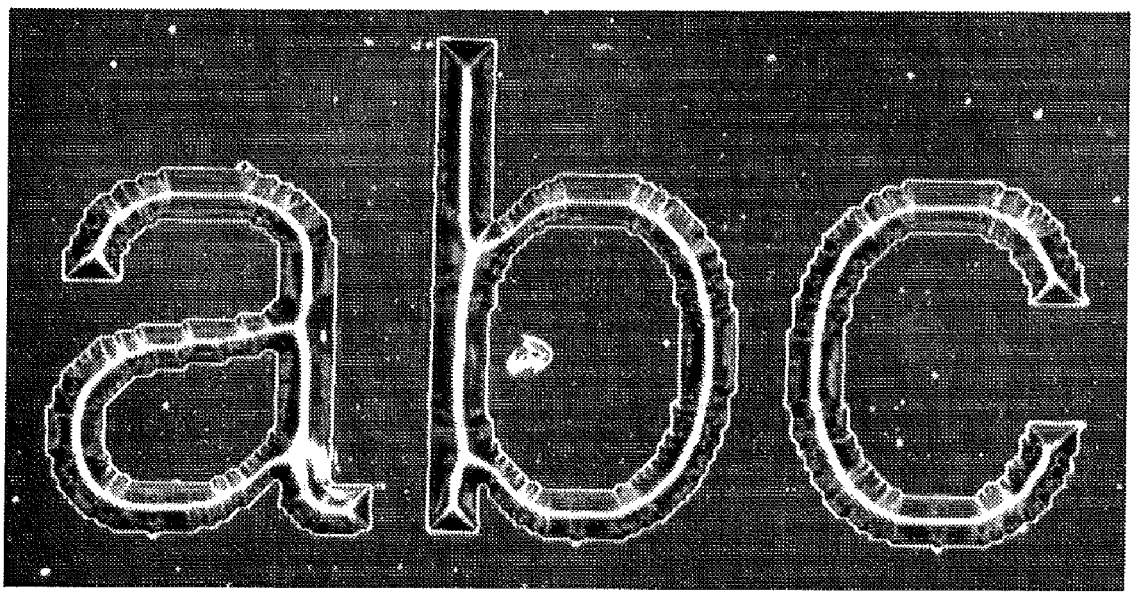

FIG. 11A illustrates a photomicrograph of reversed 3-point type produced in the flexographic plate of Example 7.

Figure 11B:
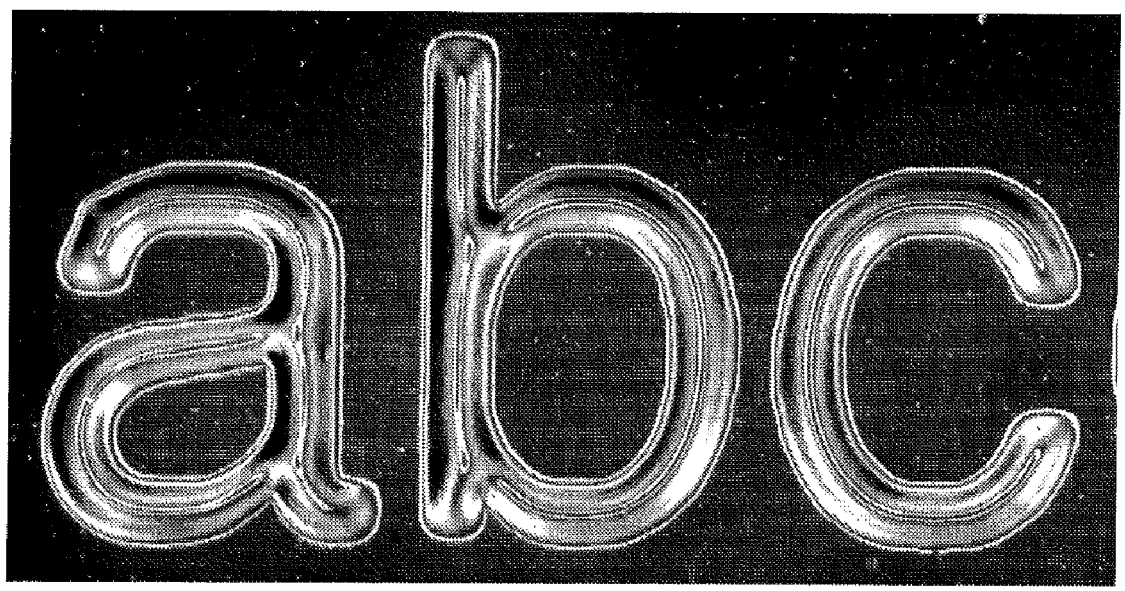

FIG. 11B illustrates a photomicrograph of 3-point type produced in the flexographic plate of Example 8.

Figure 12A:
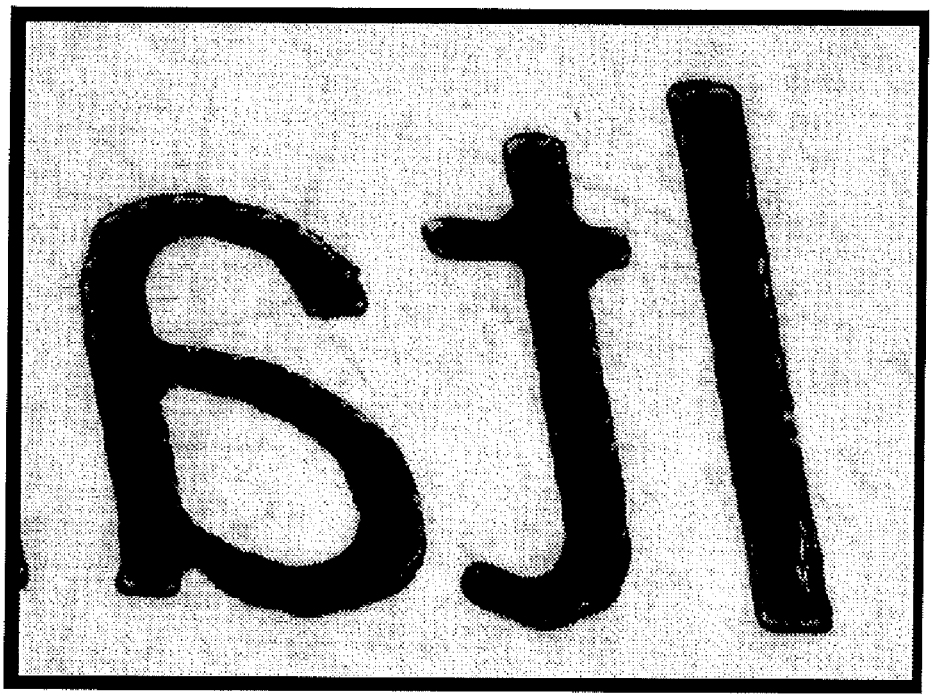

FIG. 12A illustrates a measured line width of 56 micrometers for a lower case L in four-point Helvetica type printed by first flexographic plate.

Figure 12B:

FIG. 12B illustrates a measured line width of 78 micrometers for a lower-case L in four-point Helvetica type printed by the second flexographic plate.

DETAILED DESCRIPTION OF THE INVENTION

The steps of the inventive method and the components used in this method are described further below.

Film

In the method of the present invention, a film is used to form a mask image on the carrier sheet. One step of the method includes providing a film comprising an imageable material and a carrier sheet. The imageable material is generally disposed on the carrier sheet as a relatively uniform coating of one or more layers. The film may optionally include one or more additional layers, such as a barrier layer, a release layer, an adhesive layer, or other layers. Different constructions of the film may be designed to be imaged one or more imaging methods.

The film generally includes at least two elements—a sheet-form substrate, or carrier sheet, and a layer of imageable material containing a binder, an energy absorber, and a colorant disposed on the substrate. In a particular embodiment, the binder is an adhesive binder. By using an adhesive binder in the imageable material, the mask image adheres more to the photosensitive material than to the carrier sheet. Due to the adhesion of the mask image to the photosensitive material, the step of exposing the photosensitive material may be done without the vacuum draw-down that is typically employed in the analog method of imaging a photosensitive material. When the imageable material is patternwise exposed to infrared radiation, normally from a scanning infrared laser source, the radiation is absorbed by the energy absorber which causes transfer of the imageable material or the colorant from the carrier sheet in those imaged areas. The colorant generally provides substantial opacity to the curing radiation used in a subsequent step of the method. This process is outlined in U.S. Pat. No. 5,935,758 to Patel, et al., which is hereby incorporated by reference in its entirety. Following exposure to radiation and removal of the exposed or unexposed portions of the imageable material, the remaining imageable material is referred to as the mask image.

In one embodiment, the film comprises a release layer disposed on the carrier sheet and an imageable material disposed on the release layer. In another embodiment, illustrated in FIG. 4A, the film 40 comprises a release layer 46 disposed on a carrier sheet 48, a barrier layer 44 disposed on the release layer 46, and an imageable material 42 disposed on the barrier layer 44. If particular types of imaging mechanisms are used, a receptor sheet may then be disposed on the imageable material. The carrier sheet 48, release layer 46, barrier layer 44, imageable material 42, and other layers are described further below.

Carrier Sheet

The carrier sheet of the film may be any suitable substrate. Suitable substrates include, for example, plastic sheets and films, such as polyethylene terephthalate or polyethylene naphthalate, fluorene polyester polymers, polyethylene, polypropylene, acrylics, polyvinyl chloride and copolymers thereof, and hydrolyzed and non-hydrolyzed cellulose acetate.

Where imaging radiation is used to create the mask image, it may be desirable (although not necessary) that the carrier sheet be sufficiently transparent to the imaging radiation. In some embodiments, the carrier sheet may be a transparent polymeric film. An example of a commonly employed carrier sheet is a polyethylene terephthalate sheet. Typically, the polyethylene terephthalate sheet is about 20 µm to about 200 µm thick. For example, a polyethylene terephthalate sheet sold under the name MELINEX by DuPont Teijin Films (Hopewell, Va.), such as MELINEX 574, is suitable.

If necessary, the carrier sheet may be surface-treated so as to modify its wettability and adhesion to subsequently applied coatings. Such surface treatments include corona discharge treatment, and the application of subbing layers or release layers.

Release Layer

The film may contain a release layer disposed between the carrier sheet and the imageable material. The presence of a release layer may be desirable to facilitate transfer of imageable material to a receptor sheet, or transfer of a resulting mask image to the photosensitive material in a subsequent step of the method. Generally, known articles for making a mask image may be adapted for use in the methods of the present invention by including a release layer disposed between the carrier sheet and the imageable material.

It is preferable that the release layer can be developable, dispersible, or easily removable after exposure to curing radiation through the mask image, generally during subsequent processing of the photosensitive material. Furthermore, it may be desirable to ensure that the release layer does not significantly absorb or scatter the curing radiation.

By way of example only, coatings suitable as a release layer can include poly(vinyl alcohol) or similar polymers, a cellulosic polymer such as methylcellulose or hydroxypropyl methylcellulose, or polyvinyl butyral or other hydroxylic polymer as described above. One particular example of the release layer is a hydrolized styrene maleic anhydride.

A transparent and thin release layer may be beneficial to obtain a higher resolution image. The release layer thickness may range from about 0.1 micron to 10 micron, for example. A thin release layer may be advantageous, as a thin layer does not adversely affect the resolution that is obtainable for the resulting relief image. A thin release layer may also be easier to remove during subsequent processing steps. It is preferable not to include beads or other light scattering materials in the release layer.

In one embodiment the release layer may contain a polymer or mixture of polymers that provides a desired oxygen permeability that affects the subsequent imaging of the photosensitive material, as reported in U.S. Pat. No. 5,248,583 to Lundquist, et al. for example. In these embodiments, the release layer is transferred to the photosensitive material (along with the mask image) as a fairly continuous layer. For a release layer having low oxygen permeability, curing could be more efficient to provide durability and ink receptivity. Whereas, for a release layer having higher oxygen permeability, better dot sharpness may be obtained due to reduced curing at the surface of the relief image. A thin release layer comprising a polymer having low oxygen permeability, such as methylcellulose, may provide the optimum performance of cure and dot sharpness.

In another embodiment, the release layer for a thermal ablative imaging system is a thermally resistant polymer layer. A thermally resistant polymer for the release layer is beneficial for maintaining the integrity of the release layer, and maintains good release properties even after thermal imaging. Thermal resistant polymers, such as polyimides, polysulfones, polyether ether ketone (PEEK), bisphenol-A terephthalate, polyvinyl alcohols, and polyamides are useful, provided the chosen polymer gives good release from the carrier sheet, and also can be developable, dispersible, or easily removable after exposure to curing radiation during subsequent processing of the photosensitive material.

The release layer may also comprise a crosslinking agent to provide better release properties. The release layer may also contain coating aids, surfactants, release-enhancing materials, etc. For example, the release layer may contain a suitable surfactant such as SURFYNOL 465 (ethoxylated tetramethyl decynediol) or SURFYNOL GA (acetylenic diols compounded with other non-ionic surfactants and solvents) from Air Products (Allentown, Pa.), SURFACTOL 365 (ethoxylated castor oil), from CasChem. Inc. (Bayonne, N.J.) or Triton X-100 (octylphenoxypolyethoxyethanol) from Rohm & Haas (Philadelphia, Pa.).

Barrier Layer

The film may also contain a barrier layer disposed between the carrier sheet and the imageable material. A barrier layer may be particularly suitable when the imaging method includes an ablative mechanism, for example.

Suitable barrier layers and their preparation are described, for example, in U.S. Pat. Nos. 5,468,591 and 5,576,144 to Pearce, et al., and U.S. Pat. No. 6,369,844 to Neumann, et al.

The barrier layer may include a binder, and more particularly, a "heat-combustible" binder. Suitable heat-combustible binders are reported in U.S. Pat. No. 6,521,390 to Leininbach, et al. By way of example only, suitable heat-combustible binders include poly(alkyl cyanoacrylate) and nitrocellulose. Propellant-generating polymers, such as glycidyl azide polymer ("GAP"), and other azido group-containing polymers are described in U.S. Pat. No. 5,278,023 to Bills, et al. and U.S. Pat. No. 6,027,849 to Vogel.

The barrier layer may comprise a particulate material such as metal oxide particles. One suitable particulate material for use in the barrier layer is an iron oxide particulate available from Toda Kogyco Corp., (Hiroshima, Japan). Particulate materials may provide high optical density with respect to imaging or curing radiation. Metal oxide particulates may be advantageous for an ablative imaging mechanism because they can thermally decompose to generate propulsive gases. Other suitable particulates and metal oxide particulates are reported in U.S. Pub. App. 2001/0026309, for example.

The barrier layer may optionally comprise an infrared-absorbing dye. The preferred infrared-absorbing dyes for the barrier layer are cationic infrared-absorbing dyes reported in U.S. Pat. No. 5,935,758. Particularly suitable infrared-absorbing dyes are photothermal-bleachable dyes.

The barrier layer may also comprise a crosslinking agent. The use of a crosslinking agent may impart greater thermal resistance to the barrier layer. Exemplary crosslinking agents include melamine-formaldehyde resins, such as RESIMENE from UCB Group (Belgium), dialdehydes such as glyoxal, phenolics such as DURITE from Borden Chemical Inc. (Columbus, Ohio), polyfunctional aziridines, isocyanates such as DESMODUR AP from Bayer Corp. (Pittsburgh, Pa.), urea-formaldehyde, epoxies such as EPON 1001 from Shell Chemical (Houston, Tex.). Many other suitable crosslinking agents are known in the art.

Imageable Material

The imageable material is generally disposed on the carrier sheet as a relatively uniform coating (i.e., substantially continuous and having a fairly uniform thickness). In some embodiments, the imageable material resides on the carrier sheet as a single layer. In other embodiments, the imageable material may comprise more than one layer, depending on the chosen imaging method. For example, the imageable material may include a light-to-heat converting layer, containing an energy absorber, and a layer comprising ablative or sublimable material on top of the light-to-heat converting layer.

Preferably, the components of the imaging material are chosen such that the mask image is soluble or swellable in a developer solution that is subsequently used to create the relief image, or removable by some other means, after exposure of the photosensitive material to curable radiation through the mask.

The imageable material may include a colorant. Generally, the colorant will be present in the resulting mask image, and will be capable of providing strong absorbance of the curing radiation or is otherwise capable of blocking the curing radiation, such as by reflectance. As used herein, the term "colorant" indicates a component that substantially prevents the transmission of curing radiation through the mask image. The term "colorant" does not indicate that the component necessarily provides or imparts a visible color to the imageable material, although it may do so.

The colorant generally comprises one or more dyes or pigments that will provide the desired spectral properties. The colorant is preferably present in the imageable material in an amount of about 10-50 wt %, based on the solids content of the imageable material.

The colorant can be a particulate material that is of sufficiently small particle size to be dispersed within the imageable material, with or without the aid of a dispersant. Suitable colorants for use in the imageable material include pigments, nonsublimable dyes, or sublimable dyes. Pigments and non-sublimable dyes are suitably employed because they do not tend to migrate. The use of pigment dispersions in imaging is well-known in the art, and any conventional pigments useful for that purpose may be used in the present invention.

In one embodiment of the invention, the colorant is a black dye or pigment. A suitable black dye or pigment absorbs energy at substantially all wavelengths across the visible spectrum, for example, between about 350-750 nm. However, the black dye or pigment may, for example, also absorb in the infrared or ultraviolet region as well. Suitable black dyes or pigments may also include dyes and pigments that absorb different wavelengths within the visible spectrum. These dyes or pigments may, for example, actually be a deep blue or other color. The black dye or pigment may include mixtures of dyes or pigments, or mixtures of both dyes and pigments, that individually may or may not be black but when mixed together provide a neutral black color.

For example, a mixture of NEPTUN Black, Blue Shade Magenta, and Red Shade Yellow Pigment, available from BASF (Germany), which provide a neutral black color, may be suitable. DISPERCEL CBJ from Runnemade Dispersions KV (United Kingdom) may also be suitable as the colorant.

One suitable black pigment is carbon black. Carbon black exhibits neutral color and suitable covering power. It may be desirable to use a carbon black having small particles for maximum color strength. Fine-grained carbon black brands with a mean particle size below 30 nm are especially suitable. Examples of suitable carbon black pigments include RAVEN 450, 760 ULTRA, 890, 1020, 1250, and others available from Colombian Chemicals Co. (Atlanta, Ga.), as well as BLACK PEARLS 170, BLACK PEARLS 480, VULCAN XC72, BLACK PEARLS 1100, and others available from Cabot Corp. (Waltham, Mass.). Other suitable carbon blacks include PRINTEX U, PRINTEX L6, SPEZIALSCHWARZ 4 OR SPEZIALSCHWARZ 250 of Degussa (Germany). The carbon black may comprise, for example, about 10-50 wt %, more particularly about 10-40 wt %, and even more particularly about 10-30 wt % of the total weight of the imageable material.

Imageable materials containing only carbon black are difficult to formulate due to inherent absorption of infrared radiation by the carbon black particles. Overheating of the carbon black within the imageable material may result in loss of density or increased diffusion of the mask image. Diffusion of the mask image may cause poor edge sharpness of the final imaged article. Incorporating one or more non-infrared absorbing black dyes or pigments in combination with carbon black, into the imageable material reduces the interference with the radiation and improves the quality of the imaged article that results. Even though the concentration of carbon black is reduced significantly, suitable color neutrality and opacity is maintained.

Also suitable as a pigment is a non-carbonaceous particulate material such as metal particles or metal oxide particles.

In another embodiment of the invention, the colorant may be a non-infrared absorbing black dye or pigment. Non-infrared absorbing black dyes or pigments include dyes or pigments that absorb minimal or no amount of infrared radiation.

In this embodiment, a mask image is created using an imaging radiation in the infrared region, which is absorbed by a separate infrared absorber. The colorant then would be opaque to (or reflective of) the curing radiation, which is generally ultraviolet radiation. The non-infrared absorbing colorant may absorb some infrared radiation in this embodiment, as long as there is little or no interference with the infrared absorber. For example, non-infrared absorbing black dyes or pigments may absorb less than about 0.5 absorbance unit, more particularly, less than about 0.1 absorbance unit of infrared radiation, at use concentrations.

Non-infrared absorbing black dyes and pigments include, for example, NEPTUN Black X60, PALIOGEN Black S 0084, available from BASF (Germany), as well as MICROLITH Violet B-K, available from Ciba Specialty Chemicals (Tarrytown, N.Y.). Other suitable non-infrared absorbing black dyes may be found in U.S. Pat. No. 6,001,530 to Kidnie, et al. which is incorporated herein by reference in its entirety.

In another embodiment, the imageable material may include an ultraviolet-absorbing dye as a colorant. The dye typically has a strong absorbance in the region of the spectrum to which the photosensitive material is sensitive and which is used as the curing radiation for overall exposure. The ultraviolet-absorbing dye may have an absorbance maximum in the range of about 250-600 nm, more typically between about 300-500 nm. Developer-soluble dyes are preferred. Examples of such dyes are reported in U.S. Pat. No. 3,769,019 to Weise, et al., U.S. Pat. No. 4,081,278 to Dedinas, et al. and, U.S. Pat. No. 5,399,459 to Simpson, et al. Examples of suitable ultraviolet-absorbing dyes include those marketed under the name UVINUL from BASF (Germany), and KEYPLAST YELLOW GC from Keystone Aniline Corporation (Chicago, Ill.).

The imageable material may also include an energy absorber. Excitation of the energy absorber by imaging radiation initiates a transfer of colorant or imageable material, or a physical or chemical change that alters the transparency or opacity of the imageable material to curing radiation. In some embodiments, the colorant acts as the energy absorber, and inclusion of a separate energy absorber is not required. In other words, for these embodiments the colorant serves a dual function. In other embodiments, however, a separate energy absorber is present which sensitizes the imageable material to an imaging radiation.

In one embodiment, the energy absorber may include an infrared absorber. The infrared absorber may, for example, convert infrared radiation to heat. The infrared radiation may be, for example, in the range of 750-1200 nm. The generation of heat in the imageable material may then result in a physical or chemical change in the other components of the imageable material, or induce ablation. Examples of suitable infrared absorbers include infrared-absorbing dyes such as cyanine infrared-absorbing dyes, infrared-absorbing pigments such as carbon black, or metals such as aluminum.

In some embodiments, the infrared-absorbing dye is a cationic dye. Suitable cationic dyes for use in the transfer material of the present invention include tetraarylpolymethine (TAPM) dyes, amine cation radical dyes, and mixtures thereof. Preferably, the dyes are the tetraarylpolymethine dyes. Dyes of these classes are typically stable when formulated with the other components of the imageable material and other layers of the film, and absorb in the correct wavelength ranges for use with the commonly available laser sources. Furthermore, dyes of these classes are believed to react with a latent crosslinking agent, described below, when photoexcited by laser radiation.

TAPM dyes comprise a polymethine chain having an odd number of carbon atoms (5 or more), each terminal carbon atom of the chain being linked to two aryl substituents. TAPM dyes generally absorb in the 700-900 nm region, making them suitable for diode laser address. Suitable TAPM dyes are described, for example, in U.S. Pat. No. 5,935,758 to Patel, et al.

Suitable cationic infrared-absorbing dyes include the class of amine cation radical dyes (also known as immonium dyes) reported, for example, in International Publication WO 90/12342, and in EP publication 0 739 748. Suitable cationic infrared-absorbing dyes are also described in U.S. Pat. No. 5,935,758 to Patel, et al.

The infrared-absorbing dye is preferably present in a sufficient quantity to provide a transmission optical density of at least about 0.5, more preferably, at least about 0.75, and most preferably, at least about 1.0, at the exposing wavelength. Typically, this is achieved with about 3-20 wt % infrared-absorbing dye, based on the solids content of the imageable material. The infrared-absorbing dye should be sufficient to produce substantially transparent areas where the imageable material is exposed to infrared radiation. The term "substantially transparent" means that the unmasked areas of the photosensitive material should have a transmission optical density of about 0.5 or less, more particularly about 0.1 or less, even more particularly about 0.05 or less. The transmission optical density may be measured using a suitable filter on a densitometer, such as, for example a MACBETH TR 927.

FIG. 2 illustrates the amount of energy and the amount of infrared-absorbing dye that is required to produce substantially transparent areas on the carrier sheet or receptor sheet. The graph shows the average transmission optical density ("TOD") of the exposed areas on the y-axis and the energy in $J/cm^2$ required to achieve that TOD on the x-axis. The various symbols illustrate the wt % of infrared-absorbing dye used in the imageable material. The diamond indicates the coordinates for an imageable material that contains 12.1 wt % in grams of infrared-absorbing dye. The square indicates the coordinates for an imageable material that contains 17.2 wt % in grams of infrared-absorbing dye. The triangle indicates the coordinates for an imageable material that contains 17.2 wt % in grams of infrared-absorbing dye.

In another embodiment, the energy absorber may include an ultraviolet absorber. The ultraviolet absorber may absorb radiation in the range of about 150-400 nm, for example.

The imageable material may also include a binder. Suitable binders are capable of dissolving or dispersing the other components included in the imageable material. The binder may serve several purposes depending on the imaging system.

One function of the binder is to aid in the subsequent transfer of the resulting mask image to the photosensitive layer. A binder that provides thermoplastic properties may ease the transfer of the mask image to the photosensitive material. A binder that provides better adhesion to the photosensitive material may also be helpful.

The total binder is typically present in an amount of about 25-75 wt %, and more suitably in an amount of about 35-65 wt %, based on the solids content of the imageable material.

A wide variety of binders may be suitable in the practice of the invention, with the choice of binder depending on the selected imaging method. The binder should be compatible with the other selected components of the imageable material, and should be soluble in a suitable coating solvent such as lower alcohols, ketones, ethers, hydrocarbons, haloalkanes and the like. By including an adhesive binder in the imageable material, the mask image becomes more adhesive to the photosensitive material following transfer of the mask image to the photosensitive material.

In one embodiment, the binder includes an adhesive binder. Adhesive binders are known in the art and any may be used in the method of the present invention. Particularly suitable adhesive polymers include thermally adhesive binders, for example those with a glass transition temperature (Tg) of less than about 65° C., more particularly less than about 60° C. Some examples of suitable adhesive binders include acetyl polymers and acrylamide polymers. One example of a commercially available acetyl polymer is BUTVAR B-76 from Solutia, Inc. (St. Louis, Mo.). Other binders from the BUTVAR series of polymers may also be used. One example of a commercially available acrylamide polymer is MACROMELT 6900 from Henkel Corp. (Gulph Mills, Pa.). Pressure-sensitive adhesive binders may also be suitable. Such binders are generally known in the art.

The binder may be a polymeric material that contains a plurality of hydroxy groups (i.e., a "hydroxylic polymer"). In one embodiment, 100% of the binder is a hydroxylic polymer. The hydroxy groups may be alcoholic groups or phenolic groups, or both. Binders comprising predominantly alcoholic groups are suitable. A hydroxylic polymer may be obtained by polymerization or copolymerization of hydroxy-functional monomers such as allyl alcohol and hydroxyalkyl acrylates or methacrylates, or by chemical conversion of preformed polymers, e.g., by hydrolysis of polymers and copolymers of vinyl esters such as vinyl acetate. Polymers with a high degree of hydroxy functionality, such as poly(vinyl alcohol), cellulose, etc., are in principle suitable for use in the invention, but in practice the solubility and other physico-chemical properties are less than ideal for most applications. Derivatives of such polymers, obtained by esterification, etherification, or acetalization of the bulk of the hydroxy groups, generally exhibit superior solubility and film-forming properties, and provided that at least a minor proportion of the hydroxy groups remain unreacted, they are suitable for use in the invention.

One suitable hydroxylic polymer for use as the binder is a reaction product formed by reacting poly(vinyl alcohol) with butyraldehyde. Commercial grades of this reaction product typically leave at least 5% of the hydroxy groups unreacted (i.e., free), and are generally in common organic solvents and possess excellent film-forming and pigment-dispersing properties.

A commercially available hydroxylic polymer that is suitable is a polyvinyl butyral polymer available under the trade designation BUTVAR B-76 from Solutia, Inc. (St. Louis, Mo.). This particular polymer has a softening range of about 140°-200° C. Other hydroxylic binders from the BUTVAR series of polymers may also be used. Polyvinyl butyral polymers available under the trade designations MOWITAL from Kuraray America, Inc. (New York, N.Y.) are also suitable.

Alternatively, a blend of one or more non-crosslinkable binders with one or more hydroxy-functional binders may be used. A non-crosslinkable binder should be compatible with the imaging system of the present invention such that it does not interfere with the transfer of colorant. That is, it should be nonreactive when exposed to the conditions used during imaging. Suitable non-crosslinkable binders include, for example, polyesters, polyamides, polycarbamates, polyolefins, polystyrenes, polyethers, polyvinyl ethers, polyvinyl esters, polyacrylates, polymethacrylates, and the like. An example of a suitable commercially available non-crosslinkable binder that can be combined with the hydroxylic binders described above in the imageable material includes poly(m-ethyl methacrylate) available under the trade designation ELVACITE from DuPont (Wilmington, Del.).

Binder-free imageable materials are also possible, as reported in International Publication WO 94/04368.

The imageable material may optionally include a fluorocarbon additive for enhancing transfer of a molten or softened film and production of halftone dots (i.e., pixels) having well-defined, generally continuous, and relatively sharp edges. Under imaging conditions, it is believed that the fluorocarbon additive serves to reduce cohesive forces within the imageable material at the interface between the laser-exposed heated regions and the unexposed regions, and thereby promotes clean "shearing" of the exposed regions in the direction perpendicular to the major surface of the imageable material. This provides improved integrity of the dots with sharper edges, as there is less tendency for "tearing" or other distortion as the exposed regions separate from the rest of the imageable material.

A wide variety of compounds may be employed as the fluorocarbon additive, provided that the chosen additive is substantially involatile under normal coating and drying conditions, and is sufficiently compatible with the binder(s). Thus, highly insoluble fluorocarbons, such as polytetrafluoroethylene and polyvinylidenefluoride, are unsuitable, as are gases and low boiling liquids, such as perfluoralkanes. With the above restrictions, both polymeric and lower molecular weight materials may be used.

Examples of suitable fluorocarbon additives are described in U.S. Pat. No. 5,935,758 to Patel, et al. The imageable material may also include a fluorocarbon compound as described in U.S. Pat. No. 6,664,020 to Warner, et al. Other suitable fluorocarbon compounds are reported in EP publication 0 602 893 and the references cited therein. A preferred fluorocarbon additive is a sulfonamido compound N-ethyl perfluorooctanesulfonamide having the formula $(C_8F_{17})SO_2NH(CH_2CH_3)$, which includes 70% straight chains and 30% branched chains. The fluorocarbon additive is typically used in an amount of about 1-10 wt %, based on the dry coating weight of the imageable material. Preferably, the weight ratio of fluorocarbon additive to colorant is at least about 1:10, and more preferably at least about 1:5.

A latent crosslinking agent is employed in some embodiments. A latent crosslinking agent may be especially suitable when a LIFT system is employed as the imaging mechanism. As used herein, a "latent crosslinking agent" is a compound that is capable of causing crosslinking only under conditions of laser address. It is believed that during laser imaging, the latent crosslinking agent reacts with a photoexcited infrared absorbing dye, which initiates crosslinking of the hydroxylic binder. Thus, crosslinking occurs during laser imaging.

Suitable latent crosslinking agents include compounds derived from dihydropyridine, for example. Suitable derivatives of dihydropyridine can be substituted at any of the ring positions with appropriate substituents, such as alkyl or aryl groups. In particular, 3,5-dicarboxylic diester derivatives of dihydropyridine are suitable as latent crosslinking agents. Polymers comprising a 3,5-dicarboxylic diester derivative of dihydropyridine integrated into the polymer backbone may also be suitable. Latent crosslinking agents that are useful in the imageable material are described in U.S. Pat. No. 5,935,758 to Patel, et al.

This latent crosslinking agent is present in the imageable material in an amount of up to about 30 wt %, based on the solids content of the imageable material. Alternatively, a latent crosslinking agent can be present in a receptor sheet.

The latent crosslinking agent is believed to be important for providing cohesion within the transferred colorant. This complements the action of a fluorocarbon additive, and results in transfer of the exposed region as a coherent film. It is also believed to be important for preventing retransfer of colorant back to the film, as well as back-transfer of colorant to a separate film in a subsequent imaging step.

Additional components such as, for example, plasticizers, coating aids, dispersing agents, UV absorbers, fillers, etc., can also be incorporated into the imageable material. The various additives are well-known in the art.

The imageable material may also contain, for example, a coating aid. Dispersing agents, or "dispersants," may be desirable to achieve optimum dispersion quality. Some examples of dispersing agents include, for example, polyester/polyamine copolymers, alkylarylpolyether alcohols, acrylic binders, and wetting agents. One suitable dispersant in the imageable material is a block copolymer with pigment-affinic groups, which is available under the trade designation DISPERBYK 161 from Byk-Chemie USA (Wallingford, Conn.). The dispersing agent is preferably used in the dispersion in an amount of about 1-6 wt %, based on the solids content of the imageable material.

Surfactants may be used as a coating aid to improve solution stability. A wide variety of surfactants can be used. One suitable surfactant is a fluorocarbon surfactant used in the imageable material to improve coating quality. Suitable fluorocarbon surfactants include fluorinated polymers, such as the fluorinated polymers described in U.S. Pat. No. 5,380,644 to Yonkoski, et al. An example of a suitable coating aid is a NOVEC fluorosurfactant available from 3M (St. Paul, Minn.), such as FC 4432. A suitable quantity may be in the range of about 0.05 wt %, and less than about 5 wt %, and typically is in the range of about 1-2 wt %.

Adhesive Layer

The film may also include, as a separate layer generally overlying the imageable material, an adhesive layer. The adhesive layer enhances the adhesion of the mask image to the photosensitive material during transfer, and thus aids in the transfer of the mask image. The adhesive layer may comprise a thermoplastic, thermal adhesive, or pressure-sensitive adhesive, for example. Suitable adhesives are known in the art.

Receptor Sheet

A receptor sheet is employed in some embodiments of the invention. As used herein, the phrase "receptor sheet" refers to a material, generally in sheet-form, having at least one major surface that is capable of receiving imageable material from the film.

In some embodiments, the receptor sheet acts only to receive waste imageable material from the film, and is subsequently discarded. For these embodiments, no particular construction of the receptor sheet is required; the only requirement is that it is capable of receiving imageable material.

In other embodiments of the invention, however, the receptor sheet has a major surface capable of imagewise accepting imageable material or colorant transferred from the film in transfer imaging. For these embodiments, the receptor sheet includes a sheet support having an image-receiving side and a non-imaging side.

The image-receiving major surface is generally treated or coated to facilitate the acceptance and fixation of the transferred imageable material or colorant. As necessary, the receptor sheet may have a coating on the image-receiving side of the support, having a thickness in the range of about 2-20 μm. Alternatively, the coating has a coating weight in the range of about 2-20 g/m².

The sheet support for the receptor sheet is chosen based on the particular imaging application. Suitable sheet supports include paper or card stock, metals (e.g., steel or aluminum), or films or plates composed of various film-forming polymers. Suitable polymeric materials include addition polymers (e.g., poly(vinylidene chloride), poly(vinyl chloride), poly(vinyl acetate), polystyrene, polyisobutylene polymers and copolymers), and linear condensation polymers (e.g., polyesters such as poly(ethylene terephthalate), poly(hexamethylene adipate), and poly(hexamethylene adipamide/adipate)). The sheet support may be transparent or opaque. Non-transparent sheet supports may be diffusely reflecting or specularly reflecting.

Suitable sheet supports for the receptor sheet include, for example, plastic sheet materials and films, such as polyethylene terephthalate, fluorene polyester polymers, polyethylene, polypropylene, acrylics, polyvinyl chloride and copolymers thereof, and hydrolyzed and non-hydrolyzed cellulose acetate. A particularly suitable support is a polyester film, such as a polyethylene terephthalate sheet. For example, a polyethylene terephthalate sheet sold under the name MELINEX by DuPont Teijin Films (Hopewell, Va.), such as MELINEX 574, is suitable.

In practice, the sheet support is typically about 20-200 μm thick. If necessary, the support may be pretreated so as to modify its wettability and adhesion to subsequently applied coatings. Such surface treatments include corona discharge treatment, and application of subbing layers or release layers. The sheet support may also comprise a strippable layer containing an adhesive, such as an acrylic or vinyl acetate adhesive.

Although it is not required, it may be advantageous to include a texturized surface on the image-receiving side of the receptor sheet of the present invention. A texturized surface on the sheet support or the coating may be provided by a plurality of protrusions extending from a major surface of the support or coating. The protrusions can be obtained in a variety of ways. For example, a texturizing material may be included in the coating to form the protrusions, as discussed below. Alternatively, the sheet support may be microreplicated by conventional methods, thereby forming the protrusions. A texturized receptor sheet is reported in U.S. Pat. No. 4,876,235 to DeBoer, for example.

The coating may comprise a binder capable of providing a tack-free surface at ambient temperatures, and which is compatible with the material that will be transferred from the film (such as the imageable material or colorant). The coating may contain optional additives such as surfactants, and antioxidants. The coating may also contain a texturizing material.

In choosing a polymeric binder, considerations include, for example, the glass transition temperature, softening point, and viscosity of the polymer, etc. A wide variety of polymeric binders are suitable for the practice of the present invention. The binder may include a hydroxylic polymer (i.e., a polymer having a plurality of hydroxy groups), or may include polymers free from hydroxy groups.

The choice of the polymeric binder for the coating on the receptor sheet may depend on the mechanism of colorant transfer involved (e.g., ablation, melt-stick, or sublimation). For use in an imaging system employing a melt-stick mechanism, for example, it may be advantageous to employ a similar or identical binder for the receptor sheet as is used as the binder of the imageable material on the film.

For some embodiments, BUTVAR B-76 polyvinyl butyral copolymer from Solutia, Inc. (St. Louis, Mo.) and similar thermoplastic polymers are highly suitable materials for use in the coating on the receptor sheet. Another suitable polymer for use in the coating of the receptor sheet is a polyvinyl pyrrolidone/vinyl acetate copolymer binder available under the trade designation E-735 from International Specialty Products, Inc. (Wayne, N.J.). Another suitable polymer is a styrene-butadiene copolymer available under the trade designation PLIOLITE from Goodyear Chemical (Akron, Ohio). Yet another suitable polymer is a phenoxy resin available under the trade designation INCHEMREZ PKHM-301 from InChem. Corp. (Rock Hill, S.C.).

A styrene/allyl alcohol copolymer may also be suitably included in the coating. A commercially available styrene/allyl alcohol copolymer is SAA-100 from Lyondell Chemical Company (Houston, Tex.).

Mixtures of polymers may also be suitably employed as the binder. For example, a mixture of BUTVAR B-76 and SAA-100 in a ratio of about 2:1-20:1 by weight is suitable.

The materials described above are given only as non-limiting examples. Other suitable polymers will be appreciated by those skilled in the art.

The coating on the receptor sheet may be optionally textured with a texturizing material so as to present a surface having a controlled degree of roughness. The texturizing material may be, for example, an inert particulate material such as polymeric beads, silica particles, etc.

The presence of some surface roughness is found to be advantageous when a receptor sheet is brought into proximity with a film for imaging. Protrusions in the receptor sheet regulate precisely the relationship between the film and the receptor element, and provide a generally uniform gap between the donor element and the receptor element during imaging. The magnitude of the protrusions on the receptor sheet, whether formed by beads or particulate matter or by texturing, may be measured using known techniques such as interferometry or by examination of the surface using an optical or electron microscope.

As mentioned above, the texturizing material may be an inert particulate material such as, for example, polymeric beads, silica particles, metal oxide particles, inorganic salts, etc. The shape of the beads is preferably spherical, oblong, ovoid, or elliptical. The texturizing material may be of essentially uniform size (i.e., monodisperse), or may vary in size. Dispersions of inorganic particles such as silica generally have a range of particle sizes, whereas monodisperse suspensions of polymer beads are readily available. Whichever type of population is used, the particles should not project above the plane of the surface of the receptor element by more than about 8 μm on average, but should preferably project above said plane by at least about 1 μm, and more preferably at least about 3 μm. In some constructions, it is advantageous to add two distinct sets of beads with different average sizes. This allows the flexibility to balance haze with slip or separation characteristics.

Nonlimiting examples of polymeric beads that may be suitable include poly(methyl methacrylate) and poly(stearyl methacrylate) beads, and beads comprising diol dimethacrylate homopolymers or copolymers. Suitable polymeric beads also include those made from polystyrene, phenol resins, melamine resins, epoxy resins, silicone resins, polyethylene, polypropylene, polyesters, polyimides, etc.

In general, the polymeric beads should have a particle size ranging from about 3-50 μm, preferably from about 5-25 μm. The coverage of the spacer beads in the coating may range from about 5-2,000 beads/mm$^2$. As the particle size of the beads increases, then proportionally fewer beads are required.

By way of example, one suitable texturizing material includes monodisperse beads of poly(methyl methacrylate) having an average diameter of approximately 10 μm. Such beads are commercially available.

The concentration of texturizing material in the coating on the receptor sheet should be sufficient to provide an areal density of about 100-500 particles/mm$^2$. By way of example, a suitable particle areal density is about 200 particles/mm$^2$. In one embodiment, the coating on the receptor sheet comprises about 20-80 parts binder to about 1 part texturizing material, by weight.

As an alternative to the use of beads or particles the receptor element surface may be physically textured to provide the required protrusions. Metal surfaces, such as aluminum, may be textured by graining and anodizing. Other textured surfaces may be obtained by microreplication techniques, as are known in the art.

Forming a Mask Image

In the practice of the invention, a mask image is formed on either a carrier sheet or a receptor sheet. The step of forming a mask image generally includes producing exposed areas and unexposed areas of the imageable material. The choice of imaging mechanism will determine the possible variations in forming the mask image, as discussed below.

The methods include the step of producing exposed and non-exposed areas of the imageable material. In this step, the imageable material may be exposed to imaging radiation in selected areas, otherwise known as "imagewise exposure."

Methods of imagewise exposing the film are conventional in the art. Both analog and digital methods of imagewise exposing the film are suitable. Digital methods are preferred by many users due to the ease of imaging and the increased availability of digital imaging apparatus.

Figure 1A:
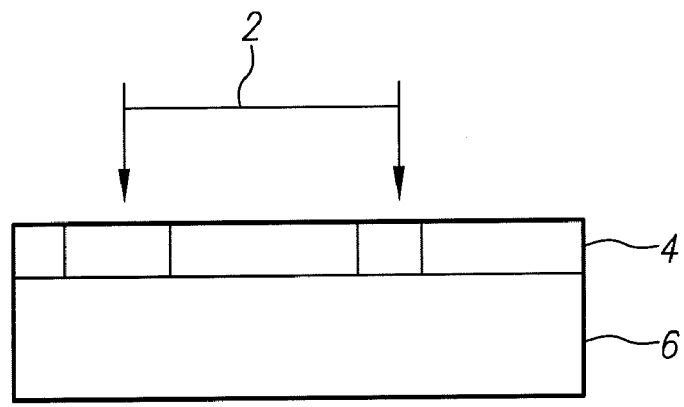
FIGS. 1A-1E schematically illustrate an embodiment of the invention that includes.
Figure 3A:
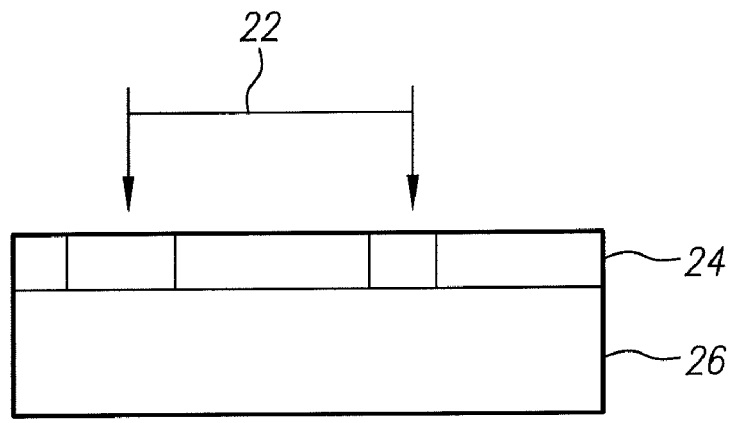

In some embodiments of the invention, imagewise exposure is efficiently accomplished using laser radiation from a laser that is scanned or rasterized under computer control. Any of the known scanning devices may be used, e.g., flat-bed scanners, external drum scanners, or internal drum scanners. In these devices, the film to be imaged is secured to the drum or bed, and the laser beam is focused to a spot that can impinge on the imageable material. The laser spot is scanned over the area to be imaged while the laser output is modulated in accordance with electronically stored image information (i.e., digital data). Two or more lasers may scan different areas of the imageable material simultaneously, to increase throughput. This embodiment is illustrated in FIGS. 1A and 3A. In FIG. 1A, infrared radiation 2 is used to produce a mask image 4 on a carrier sheet 6. Similarly, FIG. 3A illustrates infrared radiation 22 used to form a mask image 24 on a carrier sheet 26.

In certain embodiments a portion of the imageable material is imagewise exposed to infrared radiation. The infrared radiation may be, for example, in the range of about 750 nm to about 1200 nm. In the practice of this embodiment, suitable imageable materials include a component that is sensitive to infrared radiation, as described above. This component may, for example, convert infrared radiation to heat. The generation of heat in the imageable material may then result in a physical or chemical change in another component of the imageable material. In this embodiment, the film may be suitably mounted to an infrared imager and exposed imagewise to infrared radiation. Infrared radiation may be provided, for example, by an infrared laser such as a diode laser (e.g., ~830 nm) or a Nd:YAG laser (~1064 nm), which may be scanned or rasterized under computer control.

Suitable infrared imagers include those infrared imagers used in proofing processes. Examples of such infrared imagers include DESERTCAT 88, available from ECRM (Tewksbury, Mass.). Infrared imagers for CTP lithographic plate applications, such as TRENDSETTER from Creo (Burnaby, British Columbia) and DIMENSION from Presstek (Hudson, N.H.) may also be used. Imagers configured for imaging flexographic articles, such as CYREL Digital Imager (CDI SPARK) manufactured by Esko-Graphics (Kennesaw, Ga.), ThermoFlex by Creo (Burnaby, British Columbia), and OMNISETTER from Misomex International (Hudson, N.H.) could also be employed.

In other embodiments, the imageable material is exposed to visible laser light. The visible light may be, for example, in the range of about 400-750 nm. Commercially available filmsetters and imagesetters can be used. For example ACCUSET Plus (visible red laser diode, 670 nm) from Agfa-Gevaert (Belgium), ADVANTAGE DL3850 (410 nm) from Agfa-Gevaert, LUXEL V-9600 (410 nm) from Fuji Photo Film, DIAMONDSETTER (frequency-doubled Nd:YAG laser; 532 nm) from Western Lithotech (St. Louis, Mo.), SELECTSET 5000 (HeNe, 630 nm) from Agfa-Gevaert.

In still other embodiments, the imageable material is exposed to ultraviolet radiation, by laser direct imaging (LDI). The ultraviolet radiation may be in the range of about 150-410 nm. DP-100 from Orbotech (Billerica, Mass.), and DIGIRITE 2000 from Etec Systems (Tucson, Ariz.) may be suitable for UV laser imaging.

In the practice of some embodiments of the invention, a mask image is formed on the carrier sheet by producing exposed and non-exposed areas of the imageable material. The step of forming the mask image may also comprise a step of removing either exposed areas or unexposed areas of the imageable material from the film. In certain embodiments, the exposed areas are removed from the carrier sheet, leaving a mask image on the carrier sheet.

For these embodiments, a receptor sheet may optionally be used for removing waste imageable material. The receptor sheet may be any material suitable for removing the waste imageable material such as, for example, papers, transparent films, and metal sheets. One or more coatings may be applied to the receptor sheet before radiation of the film to facilitate transfer of the imageable material to the receptor. After imaging, the receptor sheet may be removed from the film to reveal the mask image on the carrier sheet. A complementary image to the mask image may remain on the receptor sheet.

In other embodiments, a mask image is formed on the carrier sheet by producing exposed and non-exposed areas of the imageable material, and removing unexposed areas from the carrier sheet.

In some embodiments, the mask image residing on the carrier sheet may optionally be cured by subjecting it to heat treatment, provided that transfer property of the mask image is not adversely affected. Heat treatment may be done by a variety of means, such as storage in an oven, hot air treatment, contact with a heated platen or passage through a heated roller device. In other embodiments, heat treatment is not necessary for curing to take place.

In still other embodiments, a mask image is formed on a receptor sheet by producing exposed and non-exposed areas of the imageable material, causing exposed areas to be transferred to the receptor sheet. In these embodiments, the carrier sheet is subsequently removed from the mask image, before the mask image is transferred to the photosensitive material. The film may be provided with a receptor sheet in contact with the imageable material, or alternatively the imageable material is contacted with a separate receptor sheet.

Suitable receptor sheets are described above. The characteristics of suitable receptor coatings may depend on the type of removal system used. For example, to promote transfer in a melt-stick system, it may be suitable to employ similar or identical binders for both the receptor coating and the binder of the imageable material. In a particular embodiment, polyvinyl butyral such as BUTVAR B-76 available from Solutia, Inc. (St. Louis, Mo.), or a similar binder is coated on to the receptor before the receptor is placed in contact with the imageable material.

Where a separate receptor sheet is used during imaging, the film and the receptor sheet are assembled in close proximity prior to imaging, with the image-receiving side of the receptor sheet adjacent to the imageable material. The phrase "close proximity" in this context can mean that the imageable material and receptor sheet are brought into contact, or that they do not contact each other but are sufficiently close to allow transfer of imageable material or colorant upon exposure to imaging radiation. Vacuum hold-down or a mechanical means may be used to secure the film and receptor sheet in assembly.

Next, the assembly of the donor and receptor sheets is imagewise exposed using imaging radiation to form a mask image, as described below. Imagewise exposure to imaging radiation causes imagewise transfer of imageable material or colorant from the film to the receptor sheet. After imaging, the film may be removed from the receptor sheet to reveal the mask image on the receptor sheet.

In some embodiments, the mask image residing on the receptor sheet may optionally be cured by subjecting it to heat treatment, provided that transfer property of the mask image is not adversely affected. Heat treatment may be done by a variety of means, such as storage in an oven, hot air treatment, contact with a heated platen or passage through a heated roller device. In other embodiments, heat treatment is not necessary for curing to take place.

Each of the foregoing variations will be discussed in detail below, in relation to several imaging mechanisms. The listed imaging mechanisms should be considered as non-limiting examples only, as the methods can be readily adapted to work with other imaging mechanisms.

Ablation

In one embodiment, the exposed areas of the imageable material are removed through ablation. In this embodiment, the exposed imageable material is propelled from the carrier sheet by generation of a gas. Specific binders that decompose upon exposure to heat (such as laser radiation) to rapidly generate a gas may be used in the imageable material. The build-up of gas under or within the exposed areas of the imageable material creates pressure that propels the imageable material off of the carrier sheet in the exposed areas. This action is distinguishable from other mass transfer techniques in that a chemical change (e.g., bond-breaking), rather than a physical change (e.g., melting, evaporation or sublimation), causes an almost complete transfer of the imageable material rather than a partial transfer.

In one ablative mode of imaging by the action of a laser beam, a film having a layer of imageable material comprising a colorant, an infrared-absorbing material, and a binder is imaged. Energy provided by the laser drives off the imageable material at the spot where the laser beam hits the element.

In one suitable embodiment, the binder serves as a "heat-combustible" material as described above, and as further discussed in U.S. Pat. No. 6,521,390 to Leinenbach, et al. The heat-combustible binder may optionally be present in a barrier layer for the practice of this embodiment.

For an ablative imaging mechanism, any colorant can be used provided it can be ablated by the action of the laser. Suitable dyes for use as the colorant are described, for example, in U.S. Pat. No. 5,576,144 to Pearce, et al. and references cited therein.

By an ablative mechanism, a mask image may be generated on a carrier sheet using a suitable film. A debris collector, such as, for example, a vacuum or a suitable receptor sheet, may be placed near imageable material to retrieve the exposed imageable material after it is propelled from the carrier sheet.

A mask image may also be generated on a suitable receptor sheet by an ablative mechanism. Ablation transfer is reported, for example, in U.S. Pat. No. 5,171,650 to Ellis, et al. and in International Publication WO 90/12342.

Melt-Stick Transfer

In still another embodiment, the exposed areas of the imageable material are removed through melt-stick. In a melt-stick system, the imageable material transfers in a molten or semi-molten state from the carrier sheet to a suitable receptor sheet upon exposure to radiation. The molten or semi-molten state is characterized by reduced viscosity, which provides flowability to the imageable material. The imageable material flows across to, and adheres to the surface of the receptor sheet with greater strength than it adheres to the carrier sheet. Physical transfer of the imageable material from the carrier sheet to the receptor sheet in exposed areas thus results. Following transfer, the carrier sheet, along with untransferred imageable material, is separated from the receptor sheet.

In one embodiment, the mask image comprises the unexposed areas remaining on the carrier sheet. In the practice of this embodiment, the receptor sheet and the transferred imageable material are generally (but not necessarily) discarded as waste.

In another embodiment, the mask image comprises the exposed areas of the imageable material that are transferred to the receptor sheet. In the practice of this embodiment, the carrier sheet and remaining imageable material are generally discarded as waste.

Further aspects and requirements for melt-stick transfer may be found in U.S. Pat. No. 5,819,661 to Lewis, et al. and in U.S. Pat. No. 5,238,778 to Hirai, et al., each of which is incorporated by reference herein.

Laser-Induced Film Transfer

In still another embodiment, the exposed areas of the imageable material are removed from the carrier sheet through laser-induced film transfer ("LIFT"). In a LIFT system, a release layer containing a latent crosslinking agent is disposed between the carrier sheet and imageable material. The crosslinking agent reacts with the binder to form a high molecular weight network in the exposed areas. The effect of this crosslinking is better control of melt flow phenomena, transfer of more cohesive material to the receptor, and higher quality edge sharpness of the mask image. Examples of this type of system may be found in U.S. Pat. No. 5,935,758 to Patel, et al. which is incorporated herein by reference in its entirety.

In one embodiment, the imageable material includes a transferable colorant and an infrared-absorbing dye. The colorant is capable of being transferred upon exposure to infrared radiation to a suitable receptor sheet. In another embodiment, the imageable material comprises a binder including a hydroxylic polymer, a transferable colorant, a fluorocarbon additive, a cationic infrared-absorbing dye, and a latent crosslinking agent, which are described above.

In one embodiment, the mask image comprises the unexposed areas remaining on the carrier sheet. In the practice of this embodiment, the receptor sheet and the transferred imageable material are generally (but not necessarily) discarded as waste.

In another embodiment, the mask image comprises the exposed areas of the imageable material that are transferred to the receptor sheet. In the practice of this embodiment, the carrier sheet and remaining imageable material are generally discarded as waste.

Peel-Apart

In yet another embodiment, the exposed areas of the imageable material are removed from the carrier sheet using a suitable receptor sheet in a so-called "peel-apart" system. A peel-apart mechanism depends on the ability to generate differential adhesion properties in the imageable material. After imagewise exposure of the film, the receptor sheet is separated from the carrier sheet, and either exposed or unexposed areas of the imageable material remain on the carrier sheet.

U.S. Pat. No. 6,013,409 to Chou (incorporated by reference herein in its entirety) describes a suitable peel-apart imaging system. One element useable for peel-apart imaging includes a carrier sheet, a "photohardenable layer" comprising colorant, a "photopolymeric adhesive" layer, and an optional release layer.

Other suitable constructions for peel-apart imaging are described in references cited at col. 3, line 25 to col. 4, line 16 of U.S. Pat. No. 6,013,409 to Chou, for example.

In one embodiment, the mask image comprises the imageable material remaining on the carrier sheet. In the practice of this embodiment, the receptor sheet and the transferred imageable material are generally (but not necessarily) discarded as waste.

In another embodiment, the mask image comprises the imageable material that is transferred to the receptor sheet. In the practice of this embodiment, the carrier sheet and remaining imageable material are generally discarded as waste.

Dye Sublimation or Diffusion

In another embodiment, colorant from the exposed areas of the imageable material is removed through sublimation. Sublimation techniques involve a mechanism wherein the colorant included in the imageable material are sublimed or diffused without simultaneous transfer of the binder. In dye sublimation, a sublimable colorant is converted into gaseous form and dissipated into the atmosphere, or optionally directed towards a suitable receptor sheet.

Dye sublimation is reported, for example, in U.S. Pat. No. 5,126,760 to DeBoer, and U.S. Pat. No. 5,994,026 to DeBoer, et al., each of which is incorporated by reference in its entirety. Thermal dye diffusion transfer as described, for example, in U.S. Pat. No. 5,330,962 to De Braabandere, et al. is also suitable as an imaging method.

Sublimable colorants that can be used include dyes described, for example, in U.S. Pat. Nos. 5,576,141, 5,576, 142, 5,521,050, 5,521,051, and 5,510,228, to Neumann, et al. Generally, such dyes are present in the imageable material in an amount of at least about 25 wt %.

By a dye sublimation mechanism, a mask image may be generated on a carrier sheet using a suitable film, and without the need for a receptor sheet.

In another embodiment, a receptor sheet is employed to capture the sublimed colorant. The mask image comprises the imageable material remaining on the carrier sheet. In the practice of this embodiment, the receptor sheet and the transferred colorant are generally (but not necessarily) discarded as waste.

In another embodiment, the mask image comprises the colorant that is transferred to a receptor sheet. In the practice of this embodiment, the carrier sheet and remaining imageable material are generally discarded as waste.

Conventional Development

In still another embodiment, the exposed areas of the imageable material are removed by development. In this embodiment, the film is washed with a suitable developer to remove the exposed areas of the imageable material, while unexposed areas remain on the carrier sheet. The imageable material in this embodiment is a positive-working imageable composition comprising the colorant. Positive-working imageable compositions are well-known in the art. Imagewise exposure of a positive-working composition causes exposed areas to become more soluble in a suitable developer solution.

Suitable developers for these positive-working imaging compositions are aqueous developers having a pH in the range of about 9 to about 14. Conventional developers comprising water, tetra-alkyl ammonium hydroxide, and surfactants, for example, are suitable.

In other embodiments, the non-exposed areas of the imageable material are removed from the carrier sheet to produce the mask image. The imageable material in this embodiment is a negative-working imageable composition comprising the colorant. Negative-working imageable compositions are well-known in the art. Imagewise exposure of a negative-working composition causes exposed areas to become insoluble in a developer solution, while unexposed areas remain soluble. By way of example, imagewise exposure may cause photopolymerization of imageable material in exposed areas.

In these embodiments, the non-exposed areas may be removed by development, for example. The film is washed with a suitable developer to remove the unexposed areas of the imageable material, while exposed areas remain on the carrier sheet. Suitable developers for negative-working systems are aqueous-based or solvent-based developing compositions. Aqueous developers typically have pH in the range of about 7 to about 13, and may comprise additives, such as water-miscible high-boiling organic solvents, surfactants, dispersants, etc.

Developers for both positive-working and negative-working compositions are commercially available from a variety of sources.

Silver Halide Emulsion

As another suitable imaging method, a mechanism that causes a physical or chemical change in the imageable material that changes the degree of opacity or transparency of the imageable material to curing radiation may be employed. One such imaging method incorporates a silver halide emulsion as the imageable material, for example.

Imaging methods using silver halide and dry silver halide, particularly laser addressable photothermographic silver halide with dry processing, are also suitable. U.S. Pat. No. 6,713,241 to Vaeth, et al. (which is incorporated by reference herein in its entirety) and references therein describes dry thermographic silver halide imaging.

Transferring the Mask Image to Photosensitive Material

In another step of the invention, the mask image is transferred to a photosensitive material that is sensitive to a curing radiation. In one embodiment, the mask image includes the exposed areas of the imageable material. In another embodiment, the mask image includes the non-exposed areas of the imageable material. The photosensitive material is hardenable or curable by exposure to the curing radiation. The photosensitive material generally includes a polymer or prepolymer, and may be hardened or cured by polymerization or crosslinking upon exposure to the curing radiation. The photosensitive material is generally, although not necessarily, disposed on a substrate.

Figure 1B:
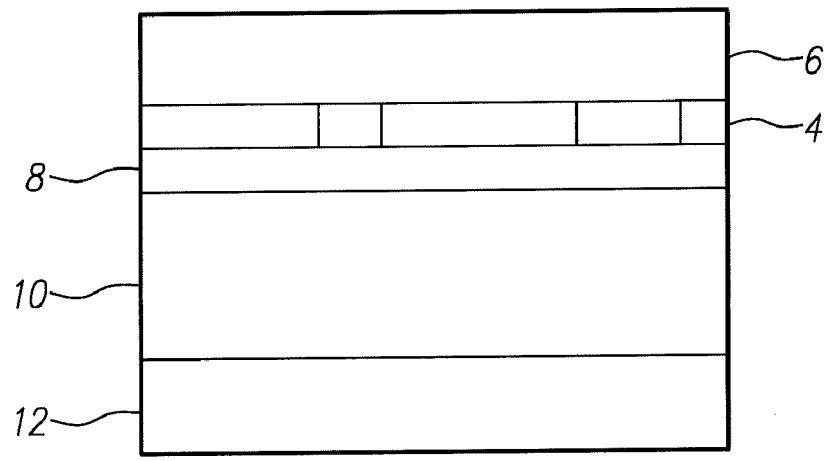
Figure 3B:
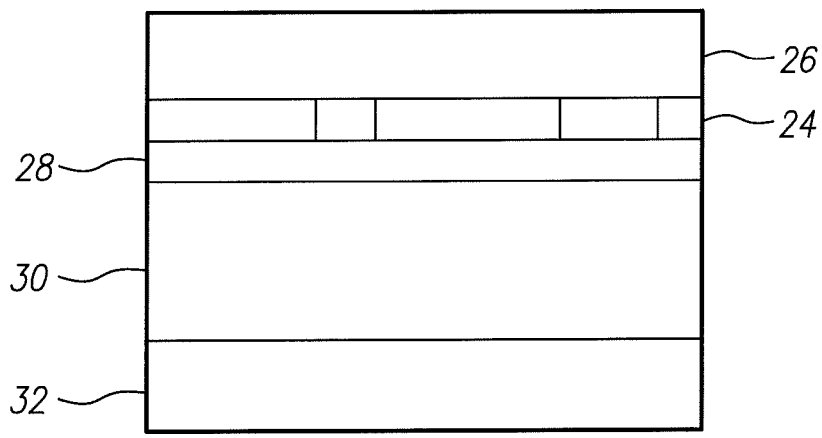

The result of one embodiment of this step is illustrated in FIGS. 1B and 3B. In FIG. 1B the mask image 4 disposed on the carrier sheet 6 is shown transferred onto a separation layer 8 that is disposed on a photosensitive material 10. In this illustrated embodiment, the photosensitive material 10 is disposed on a substrate 12. Similarly, in FIG. 3B, the mask image 24 disposed on the carrier sheet 26 is shown transferred onto a separation layer 28 that is disposed on top of a photosensitive material 30. In this illustrated embodiment, the photosensitive material 30 is disposed on a substrate 32.

Photosensitive Materials

Another component used in the method of the present invention is an imageable article that is able to produce a relief image. Examples of imageable articles include a flexographic printing plate, a printed circuit board ("PCB"), and a lithographic printing plate.

The imageable article includes at least a photosensitive material. The imageable article may also include a suitable substrate. Furthermore, optional components, such as a separation layer, a cover sheet, or a metal layer may be included in the imageable article. The photosensitive material may either be positive working or negative working. A negative working photosensitive material is hardenable or curable by exposure to a curing radiation. The photosensitive material generally includes a polymer or prepolymer, and may be hardened or cured by polymerization or crosslinking upon exposure to the curing radiation.

In some embodiments, the photosensitive material is an ultraviolet-curable resin. In particular embodiments, the ultraviolet-curable resin is disposed on a substrate and is protected by a removable cover sheet. Ideally the substrate is made from a dimensionally stable material, such as polyester film or an aluminum sheet.

A separation layer that protects the ultraviolet-curable resin from fingerprinting or other damage may be disposed between the ultraviolet curable resin and the cover sheet. This layer is sometimes referred to in the art as an anti-tack layer, release layer, slip layer, or protective layer. For the purposes of the present specification, the separation layer is considered to be part of the photosensitive material. The separation layer may include polyamide, such as for example, MACROMELT 6900, available from Henkel Corporation (Gulph Mills, Pa.), polyvinyl alcohol, copolymers of ethylene and vinyl acetate, amphoteric interpolymers, cellulosic polymers, such as hydroxyalkyl cellulose, and cellulose acetate butyrate, polybutyral, cyclic rubbers, and combinations thereof. Amphoteric interpolymers are described in U.S. Pat. No. 4,293,635 to Flint, et al. which is hereby incorporated by reference.

The ultraviolet-curable resin may also include an elastomeric binder, at least one monomer and an initiator, where the initiator has a sensitivity to non-infrared actinic radiation. In most cases, the initiator will be sensitive to ultraviolet or visible radiation or both. Examples of suitable initiator compositions have been reported in U.S. Pat. No. 4,323,637 to Chen, et al., U.S. Pat. No. 4,427,749 to Gruetzmacher, et al., and U.S. Pat. No. 4,894,315 to Feinberg, et al.

The elastomeric binder may be a single polymer or mixture of polymers which may be soluble, swellable or dispersible in aqueous, semi-aqueous or organic solvent developers. Suitable binders include those described in, U.S. Pat. No. 3,458,311 to Alles, U.S. Pat. No. 4,442,302 to Pohl, U.S. Pat. No. 4,361,640 to Pine, U.S. Pat. No. 3,794,494 to Inoue, et al., U.S. Pat. No. 4,177,074 to Proskow, U.S. Pat. No. 4,431,723 to Proskow, and U.S. Pat. No. 4,517,279 to Worns. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in U.S. Pat. No. 4,323,636 to Chen, U.S. Pat. No. 4,430,417 to Heinz, et al., and U.S. Pat. No. 4,045,231 to Toda, et al. may be used. The binder may comprise at least about 65% by weight of the ultraviolet-curable resin. The term binder, as used herein, encompasses core-shell microgels and blends of microgels and preformed macromolecular polymers, such as those described in U.S. Pat. No. 4,956,252 to Fryd, et al.

The ultraviolet-curable resin may also contain a single monomer or mixture of monomers which must be compatible with the binder to the extent that a clear, non-cloudy photosensitive layer is produced. Monomers that may be used in the ultraviolet-curable resin are well known in the art and include, but are not limited to, addition-polymerization ethylenically unsaturated compounds having relatively low molecular weights (generally less than about 30,000 Da). Suitable monomers have a relatively low molecular weight, less than about 5000 Da. Unless described otherwise, throughout the specification molecular weight is the weight-average molecular weight. Examples of suitable monomers include, but are not limited to, t-butyl acrylate, lauryl acrylate, the acrylate and methacrylate mono- and poly-esters of alcohols and polyols such as alkanols, e.g., 1,4-butanediol diacrylate, 2,2,4-trimethyl-1,3 pentanediol dimethacrylate, and 2,2-dimethylolpropane diacrylate, alkylene glycols, e.g., tripropylene glycol diacrylate, butylene glycol dimethacrylate, hexamethylene glycol diacrylate, and hexamethylene glycol dimethacrylate, trimethylol propane, ethoxylated trimethylol propane, pentaerythritol, e.g., pentaerythritol triacrylate, dipentaerythritol, and the like. Other examples of suitable monomers include acrylate and methacrylate derivatives of isocyanates, esters, epoxides and the like, such as decamethylene glycol diacrylate, 2,2-di(p-hydroxyphenyl)propane diacrylate, 2,2-di (p-hydroxyphenyl)propane dimethacrylate, polyoxyethyl-2,2-di(p-hydroxyphenyl)propane dimethacrylate, and 1-phenyl ethylene-1,2-dimethacrylate. Further examples of monomers can be found in, U.S. Pat. No. 4,323,636 to Chen, U.S. Pat. No. 4,753,865 to Fryd, et al., U.S. Pat. No. 4,726,877 to Fryd, et al., and U.S. Pat. No. 4,894,315 to Feinberg, et al. The monomer may comprise at least 5% by weight of the ultraviolet-curable resin.

The photoinitiator may be any single compound or combination of compounds which is sensitive to ultraviolet radiation, generating free radicals which initiate the polymerization of the monomer or monomers without excessive termination. The photoinitiator should be sensitive to visible or ultraviolet radiation. The photoinitiator may also be insensitive to infrared and/or visible radiation and should be thermally inactive at and below 185° C. Examples of suitable photoinitiators include the substituted and unsubstituted polynuclear quinones. Examples of suitable systems have been disclosed in, U.S. Pat. No. 4,460,675 to Gruetzmacher and U.S. Pat. No. 4,894,315 to Feinberg, et al. Photoinitiators are generally present in amounts from 0.001% to 10.0% based on the weight of the ultraviolet-curable resin.

The ultraviolet-curable resin may contain other additives depending on the final properties desired. Such additives include sensitizers, plasticizers, rheology modifiers, thermal polymerization inhibitors, tackifiers, colorants, antioxidants, antiozonants, or fillers. Plasticizers may be used to adjust the film-forming properties of the elastomer. Examples of suitable plasticizers include aliphatic hydrocarbon oils, e.g., naphthenic and paraffinic oils, liquid polydienes, e.g., liquid polybutadiene, liquid polyisoprene. Generally, plasticizers are liquids having molecular weights of less than about 5,000 Da, but can have molecular weights up to about 30,000 Da. Plasticizers having low molecular weight will encompass molecular weights less than about 30,000 Da.

The thickness of the ultraviolet-curable resin may vary depending upon the type of printing plate desired. In one embodiment, the ultraviolet-curable resin may be, for example, from about 20-250 mils (500-6400 microns) or greater in thickness, more particularly from about 20-100 mils (500-2500 microns) in thickness.

In one embodiment, the imageable article is a flexographic printing plate precursor that includes a suitable ultraviolet-curable resin. The materials that are used to make flexographic printing plates typically include a substrate, and one or more photosensitive layers comprising a photosensitive material that includes a polymer or prepolymer. Examples of commercially available flexographic printing plates that may be used in the present invention include, for example, FLEXCEL, available from Kodak Polychrome Graphics (Norwalk, Conn.), CYREL Flexographic plate, available from DuPont (Wilmington, Del.), NYLOFLEX FAR 284, available from BASF, FLEXILIGHT CBU available from Polyfibron, and ASAHI AFP XDI.

Photosensitive material may also be used with a mask image to form a printed circuit board ("PCB"). In a PCB, a conducting layer (also referred to as a printed circuit) is formed on a substrate in the pattern dictated by the mask image. The printed circuit may then direct electrical voltages and currents between various electrical components, such as resistors, capacitors, integrated circuits and other electronic devices. The electrical components are soldered onto the printed circuit at a stage after the formation of the printed circuit.

Suitable PCB precursors may contain a substrate, a metal layer and a photosensitive material. The substrate may be polyimide film, glass-filled epoxy or phenol-formaldehyde or any other insulating materials known and used in the industry, and of any thickness deemed necessary.

The metal layer covering the substrate may include a conductive metal. One suitable example is copper, although any other suitable metal or alloy of metals may be used.

The photosensitive material may include an ultraviolet-curable resin. One example of a suitable ultraviolet-curable resin for use on a PCB precursor includes oligomers and monomers, photoinitiators, and a binder.

Suitable oligomers and monomers include those that may be cross-linked, in the presence of a photoinitiator, upon exposure to ultraviolet radiation. The oligomers and monomers may include those described above. These components may comprise between 35% and 75% by weight of the ultraviolet-curable resin.

Photoinitiators should be capable of generating and promoting free radicals that will assist in cross-linking the oligomers and monomers upon exposure to ultraviolet radiation. Suitable photoinitiators are described above. The photoinitiator may comprise up to about 10% of the weight of the oligomers and monomers included in the ultraviolet-curable radiation.

The binder should be soluble in water or dilute alkali developers and well as organic developers. The binder should also be soluble in etching agents, such as aqueous ferric chloride solution. Examples of suitable binders include, for example, novolaks (functionally substituted phenol-formaldehyde resins), styrene maleic anhydride copolymers, polyvinyl methyl ether/maleic anhydride copolymer and its esters, hydroxy propyl cellulose and esterified rosin-maleic esters.

Other components, such as fillers and wetting agents, as well as dyes or pigments to aid visual examination may also be included in the ultraviolet-curable resin used in forming a PCB precursor.

The coating thickness of the ultraviolet-curable resin in the PCB precursor may be between 3 microns and 30 microns, more particularly 12 microns, in order to obtain maximal difference in solubility between cured and uncured regions and optimal adhesion properties.

The photosensitive material used in the PCB precursor construction may also be positive working, meaning that the photosensitive material becomes more developable upon exposure to ultraviolet or visible radiation. In these PCB precursors, the areas of the photosensitive material that are not exposed to radiation will remain on the PCB precursor after developing and are known in the art.

Methods of Transfer

The step of transferring the mask image includes placing the mask image and the accompanying carrier sheet or receptor sheet (the "sheet") on the photosensitive material, with the mask image in proximity with the photosensitive material. If the photosensitive material is disposed between a substrate and a cover sheet, the cover sheet or the substrate should be removed before placing the mask image in proximity to the photosensitive material. If a separation layer is included on the photosensitive material, the mask image may optionally be transferred so that the separation layer remains between the mask image and the photosensitive material.

In one embodiment, the step of transferring the mask image may include laminating the mask image to the photosensitive material. The mask image is contacted to the photosensitive material to form an assembly, and then the mask image is laminated to the photosensitive material. In some embodiments, lamination of the mask image to the photosensitive material may be accomplished by applying pressure to the assembly. In other embodiments, the mask image may be laminated to the photosensitive material by application of heat. Laminating may also include applying both pressure and heat to the assembly.

Commercially available laminators which provide both heat and pressure to the assembly may be used. Suitable laminators include, for example KODAK model 800XL APPROVAL LAMINATOR, available from Eastman Kodak Co. (Rochester, N.Y.), CODOR LPP650 LAMINATOR from CODOR laminating system, (Amsterdam, Holland), and LEDCO HD laminators, available from Filmsource (Casselbury, Fla.). These laminators provide adequate heat and pressure to laminate the mask image to the photosensitive material. One method of laminating the mask image to the photosensitive material is to place a sheet of unexposed photosensitive material disposed on a substrate on the entrance tray of the laminator. A protective cover sheet, if present, is removed from the photosensitive material. The mask image and accompanying sheet is placed on the photosensitive material, with the mask image in proximity with the photosensitive material to form an assembly. The assembly is fed into the laminator at the desired speed, temperature and pressure. After exiting the laminator, the laminated assembly of plate and mask is allowed to cool to room temperature and the sheet on the mask is peeled away from the laminated assembly.

By way of example only, a 67 mil (1.7 mm) FLEXCEL SRH photopolymer flexographic printing plate, available from Kodak Polychrome Graphics (Norwalk, Conn.), may be laminated to a mask image using the KODAK model 800XL APPROVAL LAMINATOR by removing the protective cover sheet from the plate and positioning the mask image face down on the anti-tack surface of the plate. A 50-mil paperboard stock, cut slightly longer and wider that the plate, may be placed under the assembly. The assembly may then be fed into the laminator entrance and laminated with a surface interface temperature of about 230° F. (110° C.) and a pressure of about 15 pounds per square inch (1 kg/cm$^2$). The laminator speed may be set at, for example, 30 inches/minute (76.2 cm/minute) resulting in a thermal dwell time of 48 seconds. Upon exiting the laminator the assembly may be air cooled for 3 minutes.

In another embodiment, the step of transferring may include selective adhesion of the mask image to the photosensitive material. In this embodiment, the mask image is contacted to the photosensitive material, and the mask image readily adheres to the photosensitive material, facilitating easy removal of the sheet.

In still another embodiment, the step of transferring the mask image may utilize pressure-sensitive adhesion. In this embodiment, the mask image is contacted to the photosensitive material, and under the influence of pressure the mask image becomes more adhesive to the photosensitive material than to the carrier sheet. A pressure-sensitive adhesive may be incorporated into the photosensitive material, the separation layer, or the imageable material. The pressure-sensitive adhesive may also be placed in a separate layer between the imageable material and the photosensitive material. The pressure-sensitive adhesive may include a copolymer of monomers, a first monomer being an acrylic acid ester of non-tertiary alkyl alcohol and at least one second monomer copolymerizable with the acrylic acid ester. The second monomer may be, for example, acrylic acid, methacrylic acid, itaconic acid, acrylamide, methacrylamide, acrylonitrile, or methacrylonitrile and may constitute 3 wt %-12 wt % of the total of the monomers. One example of a suitable pressure-sensitive adhesive may be found in U.S. Pat. No. Re. 24,906 to Ulrich.

In embodiments using adhesion as the method of transfer, the adhesive materials used should be selected in view of the components in the mask image and the components in the photosensitive material. Suitable adhesives should generally be transparent to and not scatter the radiation used to cure the photosensitive material. For example, an adhesive that scatters the radiation would not be suitable because it would distort the ability of the mask image to create cured and non-cured areas of the photosensitive material and reduce the resolution of the relief image.

In some embodiments, at least portions of a release layer are transferred along with the mask image to provide a desired oxygen permeability, as discussed above. At least the portions of the release layer corresponding to the transferred mask image are transferred. In other embodiments, the release layer may be transferred intact (i.e., contiguous). The transferred release layer can originate from the film, or from a receptor sheet.

Removing the Carrier Sheet or Receptor Sheet from the Mask Image

Figure 1C:
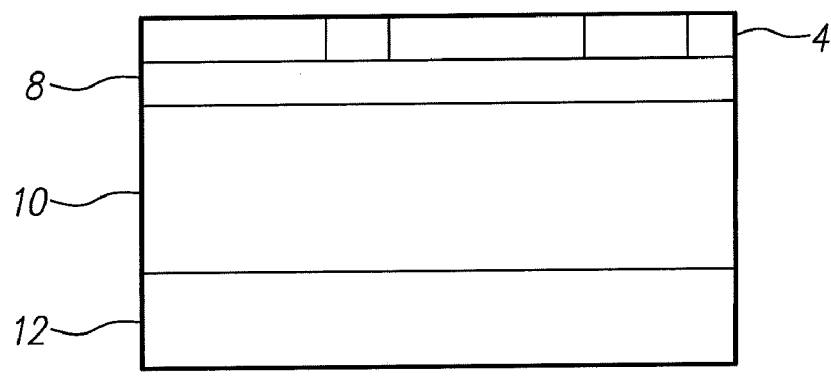
Figure 1D:
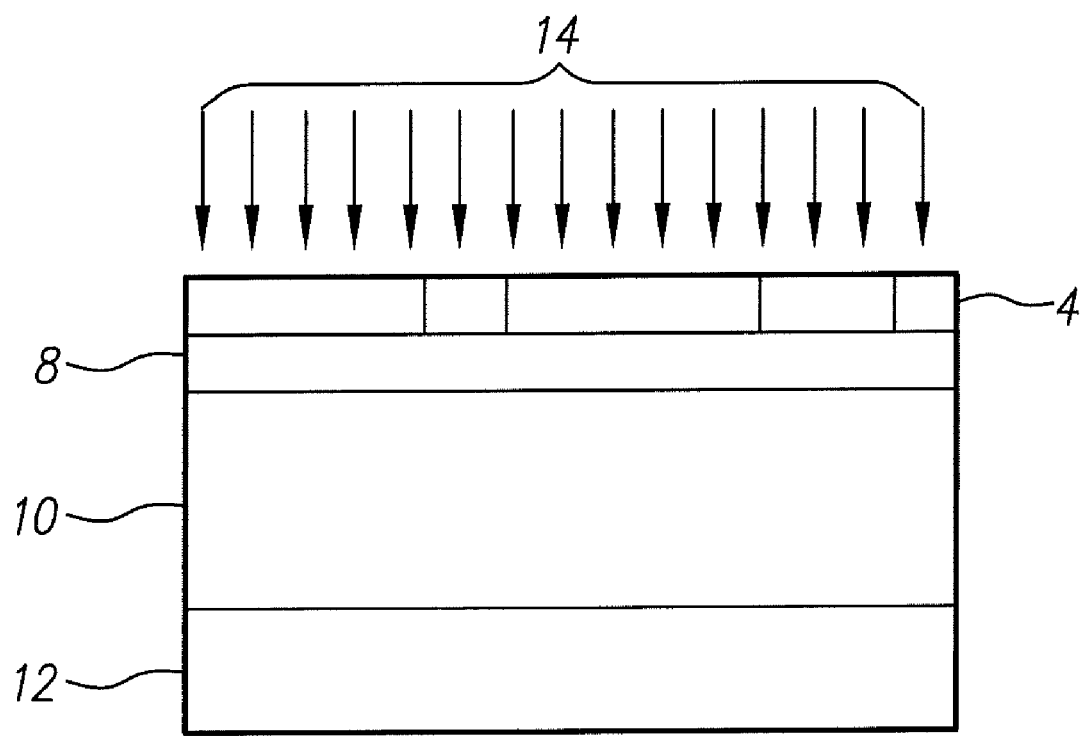

Another step of the inventive method involves removing the carrier sheet or receptor sheet (the "sheet") from the mask image on the imaged article. In one embodiment, the sheet is removed before exposing the photosensitive material to curing radiation. This embodiment is illustrated in FIGS. 1C and 1D. In FIG. 1C, the carrier sheet 6 is shown removed from the mask image 4 and the mask image 4 is left on the separation layer 8 before the photosensitive material 10 is exposed to a curing radiation 14. In the embodiment illustrated in FIG. 1D, the photosensitive material 10 is exposed to the curing radiation 14 after the carrier sheet 6 is removed from the mask image 4.

Unlike the analog methods of imaging wherein a transparent, or semi-transparent sheet remains during the curing of the photosensitive material, the method of the present invention may provide enhanced resolution for the resulting relief image for at least two reasons. First, removal of the sheet may reduce scattering of radiation during the curing of the photosensitive material. Second, since a vacuum is not required when the mask image is transferred to the photosensitive material, the matting agents, or beads, typically contained in the imageable material used in analog methods for better vacuum draw-down are not required thus avoiding the additional light scattering that sometimes results from these matting agents.

Figure 3C:
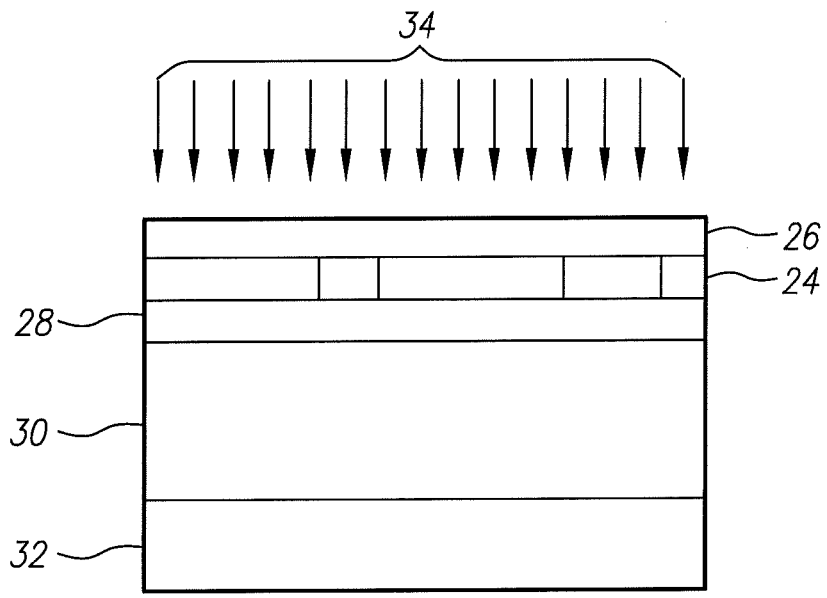
Figure 3D:
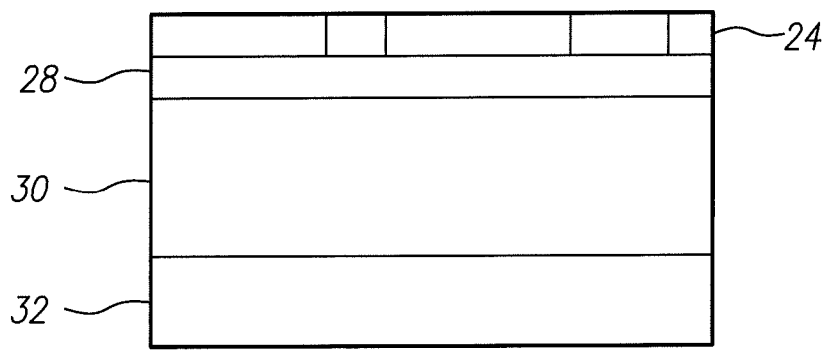
Figure 3E:
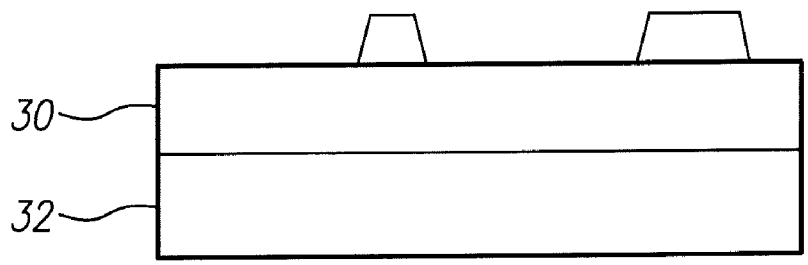

In another embodiment, the sheet is removed after exposing the photosensitive material to curing radiation. Even if the sheet is left on the mask image during exposure to the curing radiation, the method differs from the known analog method because vacuum draw-down of mask image is not required. This embodiment is illustrated in FIGS. 3C and 3D. As illustrated in FIG. 3C, a carrier sheet 26 remains on the mask image 24 while the photosensitive material 30 is exposed to the curing radiation 34. Following exposure to the curing radiation 34, the carrier sheet 26 is removed from the mask image 24, the result of which is illustrated in FIG. 3D.

The sheet may be separated from the mask by peeling the sheet away from the mask image, for example. Separating the sheet may be done manually, or it may be done mechanically. Preferably, the force required to peel the carrier sheet from the mask image is less than about 15 gm/inch, more particularly about 2.5-6 gm/inch, and eve more particularly 5 gm/inch. As described above, one embodiment of film used to form the mask image of the present invention employs a film that includes a release layer and an imageable material that includes a thermally adhesive binder. In this particular embodiment, the force required to peel the carrier sheet from the mask image of utilizing this particular film has been found to be about 5 gm/inch.

In another embodiment, the sheet is separated from the mask image by dissolving or dispersing the sheet in a suitable solvent. The solvent used in this embodiment will depend upon the type of sheet photosensitive composition and upon the mask image.

In yet another embodiment, contacting the carrier sheet with a suitable solvent may enable the carrier sheet to be released from the mask image, such as by causing adhesion failure between the carrier sheet and the mask image.

In some embodiments, a release layer is disposed between the imageable material and the sheet from which the mask image is transferred. The release layer may facilitate separation of the sheet from the mask image, enhanced resolution and better cure for longer run length and ink receptivity. However, a release layer is not required for performance of this step.

Exposing the Photosensitive Material Through the Mask Image

Another step of the invention includes exposing the photosensitive material to curing radiation through the mask image to form an imaged article. In this step, the curing radiation is projected onto the photosensitive material through the mask image, so that some of the radiation is preferentially blocked by the mask image. In unmasked areas, curing radiation will impinge upon the photosensitive material to cause hardening or curing. The mask image should therefore be substantially opaque to the radiation projected onto the photosensitive material. The term "substantially opaque" means that the mask image should have a transmission optical density of about 2.0 or greater, more particularly about 3.0 or greater. The unmasked areas should be substantially transparent. The term "substantially transparent" means that the unmasked areas of the photosensitive material should have a transmission optical density of about 0.5 or less, more particularly about 0.1 or less, even more particularly about 0.05 or less. The transmission optical density may be measured using a suitable filter on a densitometer, such as, for example a MACBETH TR 927.

This step is illustrated in FIGS. 1D and 3C. As described above, FIG. 1D illustrates an embodiment in which the photosensitive material 10 is exposed to the curing radiation 14 after the carrier sheet 6 is removed from the mask image 4. In this embodiment, the photosensitive material 10 is exposed to the curing radiation 14 through the mask image 4 after the carrier sheet 6 is removed. In another embodiment, illustrated in FIG. 3C, the photosensitive material 30 is exposed to a curing radiation 34 through the mask image 24 before the carrier sheet 26 is removed.

Generally the step of exposing the photosensitive material through the mask image may be done by floodwise exposure, since the mask image preferentially blocks the curing radiation. Floodwise exposure may be conducted in a vacuum or can be conducted outside of a vacuum, in other words, while the photosensitive element is in the presence of atmospheric oxygen. The exposure without vacuum eliminates the steps of vacuum draw-down time, and may produce sharper dots.

Some embodiments of the methods are suitable for making a relief printing plate, such as a flexographic printing plate, from a sheet-form photosensitive element having a support and a layer of photosensitive material on the support. In the manufacture of a flexographic printing plate, one side of the photosensitive material is generally first exposed to curing radiation through the support (known as "back-exposure") to prepare a thin, uniform cured layer on the support side of the photosensitive layer. The photosensitive element is then exposed to curing radiation through the mask image, thereby causing the photosensitive material to harden or cure in unmasked areas. Unexposed and uncured portions of the photosensitive material are then removed by a developing process, described below, leaving the cured portions which define the relief printing surface.

The wavelength or range of wavelengths suitable as the curing radiation will be dictated by the nature of the photosensitive material. In some embodiments, the curing radiation is ultraviolet radiation. Sources of radiation for floodwise exposure to ultraviolet radiation are conventional. Examples of suitable visible or UV sources include carbon arcs, mercury-vapor arcs, fluorescent lamps, electron flash units, and photographic flood lamps. Suitable sources of UV radiation include mercury-vapor lamps, particularly sun lamps.

One example of a suitable standard radiation source is the SYLVANIA 350 BLACKLIGHT fluorescent lamp (FR 48T12/350 VL/VHO/180, 115 w) which has a central wavelength of emission around 354 nm. Another example is the BURGESS EXPOSURE FRAME, Model 5K-3343VSII with ADDALUX 754-18017 lamp, available from Burgess Industries, Inc. (Plymouth, Minn.).

Other suitable ultraviolet radiation sources include platemakers which are able to both expose the photosensitive material to radiation and develop the photosensitive material after radiation exposure. Examples of suitable platemakers include KELLEIGH MODEL 310 PLATEMAKER available from the Kelleigh Corporation (Trenton, N.J.) and the GPP500F PLATE PROCESSOR, available from Global Asia Limited (Hong Kong).

The time for exposure through the mask image will depend upon the nature and thickness of the photosensitive material and the source of radiation. For example, in one embodiment a FLEXCEL-SRH plate precursor, available from Kodak Polychrome Graphics (Norwalk, Conn.) may be mounted on a KELLEIGH MODEL 310 PLATEMAKER available from the Kelleigh Corporation (Trenton, N.J.) and back-exposed to UV-A radiation through the support for 35 seconds to prepare a thin, uniform cured layer on the support side of the photosensitive layer. The mask image may then be transferred to the separation layer of the FLEXEL-SRH plate precursor, and the assembly may then be exposed to UV-A radiation through the mask image for 14 minutes.

Developing the Imaged Article

Figure 1E:
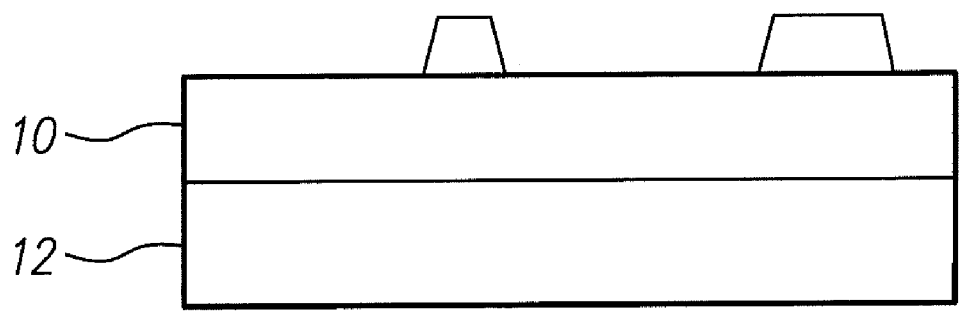

Another step of the invention includes developing the photosensitive material and mask image to form a relief image. As illustrated in FIG. 1E developing the imaged article serves to remove the uncured portions of the photosensitive material 10, leaving the cured portions which define the relief image on the photosensitive substrate 12. Generally, the mask image will also be developed away during this step.

In one embodiment, the step of developing includes washing the photosensitive material and mask image with a suitable developer. Suitable developers may dissolve, disperse, or swell the unexposed areas of the photosensitive material and mask image. Development may be carried out at about room temperature. Suitable developers include organic solutions, water, aqueous or semi-aqueous solutions. If water is used, it may contain a surfactant. The developer should be selected based upon the chemical nature of the photosensitive material. Suitable organic solution developers include aromatic or aliphatic hydrocarbons and aliphatic or aromatic halohydrocarbon solutions, or mixtures of such solutions with suitable alcohols. Other organic solution developers have been disclosed in published German Application 38 28 551 and in U.S. Pat. No. 5,354,645 to Schober et al. Suitable semi-aqueous developers may contain water and a water miscible organic solution and an alkaline material. Suitable aqueous developers usually contain water and an alkaline material. Other suitable aqueous developer combinations are described in U.S. Pat. No. 3,796,602 to Briney, et al. One suitable commercially available developer is CYREL OPTISOL ROTARY PLATE WASHOUT SOLUTION, available from DuPont Corporation (Wilmington, Del.).

Mechanical development may also be suitable. Mechanical means for development may include scrubbing or brushing the photosensitive material and mask image to remove the uncured portions. Employing mechanical means in combination with solvent development is commonly practiced.

Thermal methods of development are also suitable. One thermal method is reported, for example, in U.S. Published Application 2004/0048199 to Schadebrodt, et al. and the references discussed therein. Another thermal method, in which an absorbent layer is used to absorb the non-exposed areas of the photosensitive material is reported in U.S. Pat. No. 5,175,072 to Martens, which is hereby incorporated by reference. Other methods of thermal development may also be suitable.

Post-development processing of the relief image may be suitable in some circumstances. Typical post-development processing includes drying of the relief image to remove any excess solvent, and post-curing the photosensitive material (such as by further exposing the relief image to curing radiation) to cause further hardening or crosslinking of the photosensitive material. Such post-development processing will be familiar to those skilled in the art.

For example, the relief image may be blotted or wiped dry, and then dried in a forced air or infrared oven. Drying times and temperatures may vary. Suitable temperatures for oven drying may include, for example, about 60° C.

Flexographic printing plates may be post-exposed to ensure that the photopolymerization process is complete and that the plate will remain stable during printing and storage. This post-exposure step utilizes the same radiation source as the exposure step described above.

Detackification (which can also be referred to as "light finishing") may also be used if the surface is still tacky. Tackiness can be eliminated by methods known in the art, such as, for example, treatment with bromine or chlorine solutions. Such treatments have been reported in, for example, U.S. Pat. No. 4,400,459 to Gruetzmacher, U.S. Pat. No. 4,400,460 to Fickes et al., and German Patent 28 23 300. Detackification may also be accomplished by exposure to ultraviolet-visible radiation.

The resulting relief image may have a depth from about 2-40% of the original thickness of the photosensitive material. Thus, if the thickness of the uncured photosensitive material is 1500 µm, the depth of the relief image may be about 500 µm. For a flexographic printing plate, the depth may be about 150-500 µm. For a PCB, the photosensitive material is completely removed, in either the exposed or unexposed areas, to reveal the metal layer beneath the photosensitive material. Thus, in a PCB, the depth of the relief depends upon the thickness of the photosensitive material disposed on the metal layer. The depth of the relief is the difference in thickness of the cured photosensitive material in the raised areas (also known as "image areas") of the plate, and the thickness of the cured photosensitive material in the valleys of the plate where the photosensitive material was developed.

This invention may take on various modifications and alterations without departing from the spirit and scope thereof. It is to be understood that this invention may be suitably practiced in the absence of any element not specifically disclosed herein. In describing preferred embodiments of the invention, specific terminology is used for the sake of clarity. The invention, however, is not intended to be limited to the specific terms so selected, and it is to be understood that each term so selected includes all technical equivalents that operate similarly.

EXAMPLES

Description and sources of materials used in the Examples

AIRVOL 205—polyvinyl alcohol, as a 10% total solids solution in water, available from Air Products (Allentown, Pa.)

BUTVAR B-76—polyvinyl butyral resin, available from Solutia, Inc. (St. Louis, Mo.)

Carbon Black Millbase—a mixture of 47.52% carbon black, 47.52% BUTVAR B-76, and 4.95% DISPERBYK 161, available from BYK-Chemie USA (Wallingford, Conn.) as a 20% total solids solution in a 50:50 solvent mix of methyl ethyl ketone and Solvent PM Cellulose Nitrate—available from Aldrich Chemical (Milwaukee, Wis.)

CYASORB IR 165—infrared dye, available from Cytec Industries, Inc. (West Paterson, N.J.)

D99—IR dye YKR-2900, available from Mitsui, USA (New York, N.Y.)

FC 4432—10% NOVEC Fluorosurfactant, available from 3M Company (St. Paul, Minn.), in methyl ethyl ketone FC 55/35/10—a fluorocarbon surfactant made of a 55:35:10 ratio mixture of a terpolymer of a fluorinated acrylate, a short chain alkyl acrylate, and a polar monomer as a 7.5% total solids solution in methyl ethyl ketone unless otherwise indicated, available from 3M Company, (St. Paul, Minn.)

GANTREZ S97BF—a polymethyl vinyl ether/maleic anhydride copolymer as a 10% total solids solution in water, available from International Specialty Products, Inc. (Wayne, N.J.)

HPA-1186—a dihydropyridine derivative available from St.-Jean Photochemicals, Inc., (Quebec, Canada)

KEYPLAST Yellow—C.I. Disperse Yellow 3, available from Keystone Aniline Corporation (Chicago, Ill.)

METHOCEL A15LV—a methylcellulose, available from Dow Chemical (Midland, Mich.)

NEPTUN Black X60—C.I. Solvent Black 3, available from BASF Corporation (Charlotte, N.C.)

OPTISOL—washout solution, available from DuPont (Wilmington, Del.)

PC 364—Infrared dye with the following structure

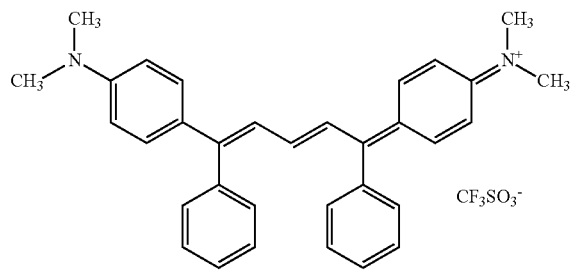

PCA—a mixture of 70 wt % poly(methyl cyanoacrylate) and 30 wt % poly(ethyl cyanoacrylate) as a 10% total solids solution in acetone Polyethylene Glycol 400—available from Aldrich Chemical (St. Louis, Mo.)

PVA 523—10% Polyvinyl Alcohol 523 in water, available from Air Products (Allentown, Pa.)

Red Shade Yellow Millbase—a mixture of 47.52% Red Shade Yellow pigment, 47.52% BUTVAR B-76, and 4.95% DISPERBYK 161, available from BYK-Chemie (Wallingford, Conn.) as a 15% total solids solution in a 50:50 solvent mix of methyl ethyl ketone and Solvent PM SANTICIZER 160—a butyl benzyl polymer, available from Ferro Corporation (Walton Hills, Ohio)

Solvent PM—propylene glycol monomethyl ether, available from Eastman Chemicals, (Kingsport, Tenn.)

TRITON X-100—a surfactant available from Rohm and Haas, (Philadelphia, Pa.) as a 10% total solids solution in water Violet Black Millbase—MICROLITH Violet B-K, available from Ciba Specialty Chemicals (Tarrytown, N.Y.), as a 10% total solids solution in methyl ethyl ketone Example 1

A relief image was formed on a flexographic printing plate by the following process. A carrier sheet, formed of 2 mil thick polyethylene terephthalate, was coated with a release layer solution containing of the components listed in Table 1 using a #10 wound-wire coating rod. The resulting article was heated in an 180° F. oven for 3 minutes to form a release layer.

TABLE 1

Components and amounts of release layer solution in Example 1

| Component | Amount in grams |
|---|---|
| PVA 523 | 50.0 |
| TRITON X-100 | 1.0 |
| de-ionized water | 39.0 |
| n-propanol | 10.0 |

A barrier layer solution of the components listed in Table 2 was mixed and applied to the release layer using a #10 wound-wire coating rod. The resulting article was heated in an 180° F. oven for 3 minutes to form a barrier layer.

TABLE 2

Components and amounts of barrier layer solution in Example 1

| Component | Amount in grams |
|---|---|
| PCA | 42.43 |
| PC 364 | 0.56 |
| FC 4432 | 0.30 |
| acetone | 46.51 |
| cyclohexanone | 10.20 |

An imageable layer solution of the components listed in Table 3 was mixed and applied to the barrier layer using #20 wound-wire coating rod. The resulting article was heated in an 180° F. oven for 3 minutes to form an imageable layer on the barrier layer.

TABLE 3

Components and amounts of imageable layer solution in Example 1

| Component | Amount in grams |
|---|---|
| Carbon Black Millbase | 27.93 |
| Violet Black Millbase | 6.86 |
| Red Shade Yellow Millbase | 5.84 |
| D99 | 1.00 |
| FC 55/35/10 | 0.67 |
| n-ethylperfluorosulfonamide | 0.74 |
| HPA-1186 | 0.13 |
| methyl ethyl ketone | 21.98 |
| cyclohexanone | 15.00 |
| Solvent PM | 20.00 |

The imageable layer was imaged using DESERTCAT 88 infrared imager, available from ECRM (Tewksbury, Mass.) emitting 830 nm radiation in the ablation mode with a focus value of 1473, a magnification setting of 510, and an energy level of 1.4 J/cm$^2$ to form an imaged film.

A CYREL analog flexographic precursor, 0.067 inch thick, available from DuPont (Wilmington, Del.) containing a substrate, a curable material, an anti-tack layer, and a cover sheet, was back-exposed with UV-A radiation through the substrate for 120 seconds on a Burgess frame high setting. The cover sheet was then removed and the flexographic precursor was placed in a 100° C. oven for 3 minutes. While the flexographic precursor was in the oven, the imaged film was laminated to the flexographic precursor by contacting, face-to-face, the imaged imageable layer with the anti-tack layer of the flexographic precursor using a hand held ink roller. The flexographic precursor and the imaged film were then removed from the oven and allowed to cool for 2 min. The carrier sheet was then peeled from the imaged imageable layer.

After the carrier sheet was peeled from the imaged imageable layer, the resulting assembly was mounted on the Burgess frame with the imaged imageable layer facing the source of the radiation and exposed to UV radiation for 600 seconds without vacuum draw-down to form an exposed flexographic precursor.

The exposed flexographic precursor was then placed in a pan and 50 ml of OPTISOL was added. The exposed flexographic precursor was brushed with the OPTISOL for 2 min. The exposed flexographic precursor was then blotted dry, washed with water to remove the PVA, and then blotted dry again. The exposed flexographic precursor was then placed back into the pan with the OPTISOL and brushed again. The brushing continued for 45 minutes during which time the OPTISOL was replaced twice.

After washing and brushing, the exposed flexographic precursor was dried for 2 hours in a 60° C. oven. The exposed flexographic precursor was then left to air dry for about 48 hours. After air drying, the exposed flexographic precursor was exposed to UV-C light for 8 minutes using a KELLEIGH MODEL 310 PLATEMAKER, available from Kelleigh Corporation (Trenton, N.J.) to form the relief image on the flexographic printing plate.

Example 2

A relief image on a flexographic printing plate was formed in the same manner as in Example 1, except that the carrier sheet was removed from the imaged imageable layer after the flexographic precursor and imaged film were exposed to UV radiation rather than before the flexographic precursor and imaged film were exposed to UV radiation.

The flexographic printing plates formed by the methods described in Example 1 and in Example 2 were used to print positive 3-point type. FIG. 5A shows an image of the type produced by the flexographic plate formed in Example 1 while FIG. 5B shows an image of the type produced by the flexographic plate formed in Example 2.

The flexographic printing plates in Example 1 and in Example 2 were also used to print 30% dots. FIG. 6A shows an image of the 30% dots produced by the flexographic plate formed in Example 1 while FIG. 6B shows an image of the 30% dots produced by the flexographic plate formed in Example 2.

Example 3

A relief image was formed on a flexographic printing plate by the following process. A carrier sheet, formed of 2 mil thick polyethylene terephthalate, was coated with a release layer solution containing of the components listed in Table 4 using a #10 wire-wound coating rod. The resulting article was heated in an 180° F. oven for 3 minutes to form a release layer.

TABLE 4

Components and amounts of release layer solution in Example 3

| Component | Amount in grams |
|---|---|
| METHOCEL A 15LV | 3.2 |
| TRITON X-100 | 1.0 |
| de-ionized water | 70.8 |
| n-propanol | 25.0 |

A barrier layer solution of the components listed in Table 5 was mixed and applied to the release layer using a #10 wire-wound coating rod. The resulting article was heated in an 180° F. oven for 3 minutes to form a barrier layer.

TABLE 5

Components and amounts of barrier layer solution in Example 3

| Component | Amount in grams |
|---|---|
| PCA | 42.43 |
| PC 364 | 0.56 |
| FC 4432 | 0.30 |
| acetone | 46.51 |
| cyclohexanone | 10.20 |

An imageable layer solution of the components listed in Table 6 was mixed and applied to the barrier layer using #20 wire-wound coating rod. The resulting article was heated in an 180° F. oven for 3 minutes to form an imageable layer on the barrier layer.

TABLE 6

Components and amounts of imageable layer solution in Example 3

| Component | Amount in grams |
|---|---|
| NEPTUN Black X60 | 0.96 |
| KEYPLAST Yellow | 2.52 |
| Cellulose Nitrate | 3.68 |
| D99 | 1.36 |
| methyl isobutyl ketone | 66.52 |
| ethyl alcohol | 25.00 |

The imageable layer was then imaged with infrared radiation in the manner described in Example 1 to form an imaged film. The non-exposed areas of the imaged imageable layer exhibited a transmission optical density of greater than 4.0, the areas exposed with 0.3 J/cm$^2$ infrared radiation exhibited a transmission optical density of 0.92, the areas exposed with 0.4 J/cm$^2$ infrared radiation exhibited a transmission optical density of 0.32, the areas exposed with 0.5 J/cm$^2$ infrared radiation exhibited a transmission optical density of 0.08, and the areas exposed with 0.6 J/cm$^2$ infrared radiation exhibited a transmission optical density of 0.04. The transmission optical densities were measured using a MACBETH TR 927 densitometer.

A FLEXCEL-SRH flexographic precursor (the "precursor"), available from Kodak Polychrome Graphics (Norwalk, Conn.), containing a substrate, a curable material, an anti-tack layer, and a cover sheet, was back-exposed with UV-A radiation through the substrate on a KELLEIGH MODEL 310 PLATEMAKER for 35 seconds, and the cover sheet was peeled from the precursor. The imaged film was laminated to the precursor by placing the precursor in the entrance to a KODAK MODEL 800XL APPROVAL LAMINATOR, available from Eastman Kodak Co. (Rochester, N.Y.), and placing the imaged film on the precursor with the imaged imageable layer facing the anti-tack layer of the precursor. The precursor and imaged film were then laminated together with a surface interface temperature of about 230° F. (110° C.) and a pressure of about 15 pounds per square inch (1 kg/cm$^2$). The laminator speed was set at 30 inches/minute (76.2 cm/minute) resulting in a thermal dwell time of 48 seconds. Upon exiting the laminator, the precursor and imaged film were air cooled for 3 minutes. The carrier sheet was then peeled from the imaged imageable layer.

After the carrier sheet was peeled from the imaged imageable layer, the resulting assembly was placed on the KELLEIGH MODEL 310 PLATEMAKER with the imaged opaque layer facing the source of the radiation. Without using a vacuum draw-down, the assembly was exposed to UV-A radiation for 14 minutes to form an exposed precursor.

The exposed precursor was then developed for 20 minutes using OPTISOL solution in the KELLEIGH MODEL 310 PLATEMAKER. After development, the precursor was dried in a 140° F. oven for 2 hours and then placed back on the KELLEIGH MODEL 310 PLATEMAKER for light finishing with UV-C radiation for 8 minutes. Finally, the precursor was post-exposed with UV-A radiation for 10 minutes to produce the relief image on the flexographic printing plate.

Example 4

A relief image was formed on a flexographic printing plate by the following process. A carrier sheet, formed of 2 mil thick polyethylene terephthalate, was coated with a release layer solution containing of the components listed in Table 7 using a #10 wound-wire coating rod. The resulting article was heated in an 180° F. oven for 3 minutes to form a release layer.

TABLE 7

Components and amounts of release layer solution in Example 4

| Component | Amount in grams |
| --- | --- |
| METHOCEL A 15LV | 3.2 |
| TRITON X-100 | 1.0 |
| de-ionized water | 70.8 |
| n-propanol | 25.0 |

A barrier layer solution of the components listed in Table 8 was mixed and applied to the release layer using a #10 wound-wire coating rod. The resulting article was heated in an 180° F. oven for 3 minutes to form a barrier layer.

TABLE 8

Components and amounts of barrier layer solution in Example 4

| Component | Amount in grams |
| --- | --- |
| PCA | 42.43 |
| CYASORB IR 165 | 0.56 |
| FC 4432 | 0.30 |
| acetone | 46.51 |
| cyclohexanone | 10.20 |

An imageable layer solution of the components listed in Table 9 was mixed and applied to the barrier layer using a wound-wire coating rod to achieve a transmission optical density of 4.0. The resulting article was heated in an 180° F. oven for 3 minutes to form an imageable layer.

TABLE 9

Components and amounts of imageable layer solution in Example 4

| Component | Amount in grams |
| --- | --- |
| Carbon Black Millbase | 32.86 |
| Violet Black Millbase | 8.07 |
| Red Shade Yellow Millbase | 6.87 |
| CYASORB IR 165 | 1.00 |
| FC 55/35/10 | 0.67 |
| n-ethylperfluorosulfonamide | 0.83 |
| methyl ethyl ketone | 19.51 |
| cyclohexanone | 20.00 |
| Solvent PM | 10.00 |

The imageable layer was then imaged with infrared radiation with an Esko-Sparks laser imager, available from Esko-Graphics (Kennesaw, Ga.), with a wavelength of 1064 nm, to form an imaged film. The non-exposed areas of the imageable layer exhibited a transmission optical density of greater than 4.0, the areas exposed with 1.2 J/cm$^2$ infrared radiation exhibited a transmission optical density of 0.35, the areas exposed with 1.55 J/cm$^2$ infrared radiation exhibited a transmission optical density of 0.09, the areas exposed with 2.2 J/cm$^2$ infrared radiation exhibited a transmission optical density of 0.03, and the areas exposed with 3.3 J/cm$^2$ infrared radiation exhibited a transmission optical density of 0.03. The transmission optical densities was measured using a MACBETH TR 927 densitometer.

The imaged film was then laminated to a FLEXCEL-SRH flexographic precursor available from Kodak Polychrome Graphics (Norwalk, Conn.) and exposed to UV radiation in the manner described in Example 3 to produce a relief image on the flexographic printing plate.

Example 5

A mask was formed on the surface of a flexographic plate by the following process. A carrier sheet, formed of 2 mil thick polyethylene terephthalate, was coated with a release layer solution containing of the components listed in Table 10 using a #10 wire-wound coating rod. The resulting article was heated in an 180° F. oven for 3 minutes to form a release layer.

TABLE 10

Components and amounts of release layer solution in Example 5

| Component | Amount in grams |
| --- | --- |
| PVA 523 | 50.00 |
| TRITON X-100 | 1.0 |
| de-ionized water | 70.8 |
| n-propanol | 25.0 |

A barrier layer solution of the components listed in Table 11 was mixed and applied to the release layer using a #10 wire-wound coating rod. The resulting article was heated in an 180° F. oven for 3 minutes to form a barrier layer.

TABLE 11

Components and amounts of barrier layer solution in Example 5

| Component | Amount in grams |
| --- | --- |
| PCA | 42.43 |
| PC 364 | 0.56 |
| FC 4432 | 0.30 |
| acetone | 46.51 |
| cyclohexanone | 10.20 |

An imageable layer solution of the components listed in Table 12 was mixed and applied to the barrier layer using a wound wire coating rod to form an imageable layer with a transmission optical density of 4.0.

TABLE 12

Components and amounts of imageable layer solution in Example 5

| Component | Amount in grams |
| --- | --- |
| Carbon Black Millbase | 27.93 |
| Violet Black Millbase | 6.86 |
| Red Shade Violet Millbase | 5.84 |
| D99 | 1.0 |

TABLE 12-continued

Components and amounts of imageable layer solution in Example 5

| Component | Amount in grams |
|---|---|
| FC 55/35/10 | 0.67 |
| methyl ethyl ketone | 21.98 |
| cyclohexanone | 15.00 |
| Solvent PM | 20.00 |

An APPROVAL INTERMEDIATE RECEPTOR SHEET, available from Kodak Polychrome Graphics (Norwalk, Conn.), was placed in proximate contact with the imageable layer. The imageable layer was then imaged through the carrier sheet on a DESERTCAT 88 imager using 830 nm radiation at 400 mJ using vacuum hold-down. The approval intermediate receptor sheet received the imaged imageable material from the carrier sheet. The imaged imageable material on the approval intermediate receptor sheet was then laminated onto a FLEXCEL-SRH flexographic precursor available from Kodak Polychrome Graphics (Norwalk, Conn.) using a KODAK model 800XL APPROVAL LAMINATOR. The reverse image remaining on the carrier sheet was also laminated to another FLEXCEL-SRH flexographic precursor available from Kodak Polychrome Graphics (Norwalk, Conn.) using a KODAK model 800XL APPROVAL LAMINATOR.

Example 6

A first flexographic printing plate was made by the following process. An imaged film was made in the manner described in Example 1. The imaged film was then laminated to a CYREL analog flexographic precursor, available from DuPont (Wilmington, Del.), the carrier sheet was removed from the imaged imageable layer and the precursor was exposed to UV radiation and developed all in the manner described in Example 1. The resulting relief image on the flexographic plate had a height of 22 mil.

A second flexographic printing plate was made by a known integral mask method. A commercially available sample of DuPont CDI digital flexographic material, available from DuPont (Wilmington, Del.), was laser exposed on the DESERTCAT 88 imager then exposed to UV radiation and developed as described in Example 1. The resulting relief image on the flexographic plate had a height of 23 mil.

The first flexographic plate was then mounted on the plate cylinder of a Mark Andy 2200F narrow-width flexographic press, available from Mark Andy, Inc. (St. Louis, Mo.) and used to process UV process black ink, available from Akzo Nobel, Inc. (Chicago, Ill.) onto 10 inch wide Westvaco #2 paper. The second flexographic plate was used in the same manner as the first flexographic plate to print images using the same type of paper, ink and using the same flexographic press. The printed images produced by the first and second flexographic plates were compared.

The spatial resolution in printed images from a flexographic plate produced by a method of the invention is also better than the spatial resolution in images printed from a flexographic plate produced by a known integral mask method. FIG. 7A, for example, shows a measured line width of 56 micrometers in a lower-case L in four-point Helvetica type printed by a flexographic plate produced by a method of the invention. FIG. 7B shows a measured line width of 81 micrometers in a lower-case L in four-point Helvetica type printed by a flexographic plate produced by a known integral mask method.

The improved resolution of printing by a flexographic plate produced by a method of the invention is also illustrated by the narrower printed width of 80 micrometer fine lines. The fine lines printed from a flexographic plate produced by a known integral mask method, shown in FIG. 8B, were found to be approximately 40% wider than those printed by a flexographic plate produced by a method of the invention, shown in FIG. 8A.

Improved transmission of UV-A and visible light by an article produced by a method of the invention can be seen in FIGS. 9A, 9B, and 9C. FIG. 9A shows 25% dots produced by a known Silver Halide mask, transmitting 88%-90% of UV-A radiation. FIG. 9B shows 25% dots produced by an integral mask method, transmitting 73%-78% of UV-A radiation. FIG. 9C shows 25% dots produced by a mask image produced by a method of the invention, transmitting 95%-98% of UV-A radiation.

Example 7

A relief image was formed on a flexographic printing plate by the following process. A carrier sheet, formed of 2 mil thick polyethylene terephthalate, was coated with a release layer solution containing of the components listed in Table 13 using a #10 wound-wire coating rod. The resulting article was heated in an 180° F. oven for 3 minutes to form a release layer on the carrier sheet.

TABLE 13

Components and amounts of the release layer solution in Example 7

| Component | Amount in grams |
|---|---|
| GANTREZ S97BF | 28.5 |
| AIRVOL 205 | 19.0 |
| TRITON X-100 | 1.5 |
| Polyethylene Glycol 400 | 0.25 |
| de-ionized water | 32.1 |
| n-propanol | 20.0 |

A barrier layer solution of the components listed in Table 14 was mixed and applied to the release layer using a #10 wound-wire coating rod. The resulting article was heated in an 180° F. oven for 3 minutes to form a barrier layer on the release layer.

TABLE 14

Components and amounts of the barrier layer solution in Example 7

| Component | Amount in grams |
|---|---|
| PCA | 44.5 |
| D99 | 0.55 |
| FC 55/35/10 (as a 10% total solids solution in methyl ethyl ketone) | 0.40 |
| acetone | 5.0 |
| cyclohexanone | 49.55 |

A solution of imageable material containing the components listed in Table 15 was mixed and applied to the barrier layer using #20 wound-wire coating rod. The resulting article was heated in an 180° F. oven for 3 minutes to form a layer of imageable material on the barrier layer.

TABLE 15

Components and amounts of the solution of imageable material in Example 7

| Component | Amount in grams |
|---|---|
| NEPTUN Black X60 | 0.47 |
| KEYPLAST Yellow | 1.60 |
| curcumin | 0.80 |
| cellulose nitrate | 2.74 |
| BUTVAR B-76 (as a 10% total solids solution in methyl ethyl ketone) | 9.06 |
| D99 | 1.20 |
| SANTICIZER 160 | 0.36 |
| methyl isobutyl ketone | 58.77 |
| ethyl alcohol | 25.00 |

The layer of imageable material was imaged using DESERTCAT 88 infrared imager, available from ECRM (Tewksbury, Mass.) emitting 830 nm radiation in the ablation mode at an energy level of 0.7 J/cm$^2$ to form an imaged film.

A FLEXCEL-SRH flexographic precursor (the "precursor"), available from Kodak Polychrome Graphics (Norwalk, Conn.), containing a substrate, a curable material, an anti-tack layer, and a cover sheet, was back-exposed with UV-A radiation through the substrate on a KELLEIGH MODEL 310 PLATEMAKER for 35 seconds, and the cover sheet was peeled from the precursor. The imaged film was laminated to the precursor by placing the precursor in the entrance to a KODAK MODEL 800XL APPROVAL LAMINATOR, available from Eastman Kodak Co. (Rochester, N.Y.), and placing the article on the precursor with the imaged layer of imageable material facing the anti-tack layer of the precursor. The precursor and imaged film were then laminated together with a surface interface temperature of about 230° F. (110° C.) and a pressure of about 15 pounds per square inch (1 kg/cm$^2$). The laminator speed was set at 30 inches/minute (76.2 cm/minute) resulting in a thermal dwell time of 48 seconds. Upon exiting the laminator, the precursor and imaged film were air cooled for 3 minutes to form an assembly of the imaged film on the flexographic precursor.

After cooling, the assembly was placed on the KELLEIGH MODEL 310 PLATEMAKER with the imaged film facing the source of the radiation. Without using a vacuum drawdown, the assembly was exposed to UV-A radiation for 13 minutes to form an exposed precursor.

Following exposure, the carrier sheet was removed by manually peeling the carrier sheet from the remaining components of the imaged film.

The exposed precursor and remaining components of the imaged film were then developed for 20 minutes using OPTISOL solution in the KELLEIGH MODEL 310 PLATEMAKER to form a relief image. After development, the relief image was dried in a 140° F. oven for 2 hours and then placed back on the KELLEIGH MODEL 310 PLATEMAKER for light finishing with UV-C radiation for 8 minutes. Finally, the relief image was post-exposed with UV-A radiation for 10 minutes.

Example 8

Comparative

A relief image on a flexographic printing plate was formed in the same manner as in Example 7, except that the assembly of the imaged film on the flexographic precursor was exposed to UV radiation while in vacuum contact with the FLEXCEL-SRH flexographic plate in the manner used with conventional silver halide masks.

The flexographic printing plates formed by the methods described in Example 7 and in Example 8 were examined microscopically at 75× using back illumination. FIG. 10A shows an image of 4-point type produced in the flexographic plate of Example 7 while FIG. 10B shows a digital image of 4-point type produced in the flexographic plate of Example 8.

The digital images of small type produced from the transfer and contact mask exposures (shown in FIGS. 10A and 10B) show that the transferred mask is able to reproduce significantly sharper and distinct small detail compared with the contact mask exposure.

The flexographic printing plates of Examples 7 and 8 also contained 3-point reversed type which was examined microscopically at 75× using top-surface illumination. FIG. 11A shows a photomicrograph of reversed 3-point type produced in the flexographic plate of Example 7 while FIG. 11B shows a photomicrograph of 3-point type produced in the flexographic plate of Example 8. Once again, the transferred mask reproduced significantly sharper small detail compared with the contact mask exposure.

Example 9

A relief image was formed on a flexographic printing plate by the following process. A carrier sheet, formed of 2 mil thick polyethylene terephthalate, was coated with a release layer solution containing of the components listed in Table 16 using a #10 wire-wound coating rod. The resulting article was heated in an 180° F. oven for 3 minutes to form a release layer on the carrier sheet.

TABLE 16

Components and amounts of the release layer solution in Example 9

| Component | Amount in grams |
|---|---|
| METHOCEL A 15LV | 3.2 |
| TRITON X-100 | 1.0 |
| de-ionized water | 70.8 |
| n-propanol | 25.0 |

A barrier layer solution of the components listed in Table 17 was mixed and applied to the release layer using a #10 wire-wound coating rod. The resulting article was heated in an 180° F. oven for 3 minutes to form a barrier layer on the release layer.

TABLE 17

Components and amounts of the barrier layer solution in Example 9

| Component | Amount in grams |
|---|---|
| PCA | 42.43 |
| PC 364 | 0.56 |
| FC 4432 | 0.30 |
| acetone | 46.51 |
| cyclohexanone | 10.20 |

A solution of imageable material containing the components listed in Table 18 was mixed and applied to the barrier layer using #20 wire-wound coating rod. The resulting article was heated in an 180° F. oven for 3 minutes to form a layer of imageable material on the barrier layer.

TABLE 18

Components and amounts of the solution
of imageable material in Example 9

| Component | Amount in grams |
|---|---|
| NEPTUN Black X60 | 0.96 |
| KEYPLAST Yellow | 2.52 |
| cellulose nitrate | 3.68 |
| D99 | 1.36 |
| methyl isobutyl ketone | 66.52 |
| ethyl alcohol | 25.00 |

The imageable material was then imaged with infrared radiation in the manner described in Example 7 to form an imaged film. The non-exposed areas of the imaged film exhibited a transmission optical density of greater than 4.0 and the areas exposed with 0.3 J/cm$^2$ infrared radiation exhibited a transmission optical density of 0.92, the areas exposed with 0.4 J/cm$^2$ infrared radiation exhibited a transmission optical density of 0.32, the areas exposed with 0.5 J/cm$^2$ infrared radiation exhibited a transmission optical density of 0.08 and the areas exposed with 0.6 J/cm$^2$ infrared radiation exhibited a transmission optical density of 0.04. The transmission optical densities were measured using a MACBETH TR 927 densitometer.

A FLEXCEL-SRH flexographic precursor (the "precursor"), available from Kodak Polychrome Graphics (Norwalk, Conn.), containing a substrate, a curable material, an anti-tack layer, and a cover sheet, was back-exposed with UV-A radiation through the substrate on a KELLEIGH MODEL 310 PLATEMAKER for 35 seconds, and the cover sheet was peeled from the precursor. The imaged film was laminated to the precursor by placing the precursor in the entrance to a KODAK MODEL 800XL APPROVAL LAMINATOR, available from Eastman Kodak Co. (Rochester, N.Y.), and placing the article on the precursor with the imaged layer of imageable material facing the anti-tack layer of the precursor. The precursor and imaged film were then laminated together with a surface interface temperature of about 230° F. (110° C.) and a pressure of about 15 pounds per square inch (1 kg/cm$^2$). The laminator speed was set at 30 inches/minute (76.2 cm/minute) resulting in a thermal dwell time of 48 seconds. Upon exiting the laminator, the precursor and imaged film were air cooled for 3 minutes to form an assembly of the imaged film on the flexographic precursor.

After cooling, the assembly was placed on the KELLEIGH MODEL 310 PLATEMAKER with the imaged film facing the source of the radiation. Without using a vacuum drawdown, the assembly was exposed to UV-A radiation for 14 minutes to form an exposed precursor.

Following exposure, the carrier sheet was removed by manually peeling the carrier sheet from the remaining components of the imaged film.

The exposed precursor and the remaining components of the imaged film were then developed for 20 minutes using OPTISOL solution in the KELLEIGH MODEL 310 PLATEMAKER to form a relief image. After development, the relief image was dried in a 140° F. oven for 2 hours and then placed back on the KELLEIGH MODEL 310 PLATEMAKER for light finishing with UV-C radiation for 8 minutes. Finally, the relief image was post-exposed with UV-A radiation for 10 minutes.

Example 10

A relief image was formed on a flexographic printing plate by the following process. A carrier sheet, formed of 2 mil thick polyethylene terephthalate, was coated with a release layer solution containing of the components listed in Table 19 using a #10 wound-wire coating rod. The resulting article was heated in an 180° F. oven for 3 minutes to form a release layer.

TABLE 19

Components and amounts of the release
layer solution in Example 10

| Component | Amount in grams |
|---|---|
| METHOCEL A 15LV | 3.2 |
| TRITON X-100 | 1.0 |
| de-ionized water | 70.8 |
| n-propanol | 25.0 |

A barrier layer solution of the components listed in Table 20 was mixed and applied to the release layer using a #10 wound-wire coating rod. The resulting article was heated in an 180° F. oven for 3 minutes to form a barrier layer on the release layer.

TABLE 20

Components and amounts of barrier layer solution in Example 10

| Component | Amount in grams |
|---|---|
| PCA | 42.43 |
| CYASORB IR 165 | 0.56 |
| FC 4432 | 0.30 |
| acetone | 46.51 |
| cyclohexanone | 10.20 |

A solution of imageable material containing the components listed in Table 21 was mixed and applied to the barrier layer using a wound-wire coating rod to achieve a transmission optical density of 4.0. The resulting article was heated in an 180° F. oven for 3 minutes to form a layer of imageable material on the barrier layer.

TABLE 21

Components and amounts of the solution
of imageable material in Example 10

| Component | Amount in grams |
|---|---|
| Carbon Black Millbase | 32.86 |
| Violet Black Millbase | 8.07 |
| Red Shade Yellow Millbase | 6.87 |
| CYASORB IR 165 | 1.00 |
| FC 55/35/10 | 0.67 |
| n-ethylperfluorosulfonamide | 0.83 |
| methyl ethyl ketone | 19.51 |
| cyclohexanone | 20.00 |
| Solvent PM | 10.00 |

The layer of imageable material was then imaged with infrared radiation with an Esko-Sparks laser imager, available from Esko-Graphics (Kennesaw, Ga.), with a wavelength of 1064 nm, to form an imaged film. The non-exposed areas of the imaged imageable material exhibited a transmission optical density of greater than 4.0 and the areas exposed with 1.2 J/cm$^2$ infrared radiation exhibited a transmission optical density of 0.35, the areas exposed with 1.55 J/cm$^2$ infrared radiation exhibited a transmission optical density of 0.09, the areas exposed with 2.2 J/cm$^2$ infrared radiation exhibited a transmission optical density of 0.03 and the areas exposed with 3.3 J/cm$^2$ infrared radiation exhibited a transmission optical density of 0.03. The transmission optical densities was measured using a MACBETH TR 927 densitometer.

The imaged film was then laminated to a FLEXCEL-SRH flexographic precursor available from Kodak Polychrome Graphics (Norwalk, Conn.) and exposed to UV radiation and developed in the manner described in Example 9 to produce a relief image on the flexographic printing plate.

Example 11

A mask was formed on the surface of a flexographic plate by the following process. A carrier sheet, formed of 2 mil thick polyethylene terephthalate, was coated with a release layer solution containing of the components listed in Table 22 using a #10 wire-wound coating rod. The resulting article was heated in an 180° F. oven for 3 minutes to form a release layer.

TABLE 22

Components and amounts of the release layer solution in Example 11

| Component | Amount in grams |
|---|---|
| PVA 523 | 50.00 |
| TRITON X-100 | 1.0 |
| de-ionized water | 70.8 |
| n-propanol | 25.0 |

A barrier layer solution of the components listed in Table 23 was mixed and applied to the release layer using a #10 wire-wound coating rod. The resulting article was heated in an 180° F. oven for 3 minutes to form a barrier layer on the release layer.

TABLE 23

Components and amounts of the barrier layer solution in Example 11

| Component | Amount in grams |
|---|---|
| PCA | 42.43 |
| PC 364 | 0.56 |
| FC 4432 | 0.30 |
| acetone | 46.51 |
| cyclohexanone | 10.20 |

A solution of imageable material containing the components listed in Table 24 was mixed and applied to the barrier layer using a wound wire coating rod to form a layer of imageable material with a transmission optical density of 4.0 on the barrier layer.

TABLE 24

Components and amounts of the solution of imageable material in Example 11

| Component | Amount in grams |
|---|---|
| Carbon Black Millbase | 27.93 |
| Violet Black Millbase | 6.86 |
| Red Shade Violet Millbase | 5.84 |
| D99 | 1.0 |
| FC 55/35/10 | 0.67 |
| methyl ethyl ketone | 21.98 |
| cyclohexanone | 15.00 |
| Solvent PM | 20.00 |

An approval intermediate receptor sheet, available from Kodak Polychrome Graphics (Norwalk, Conn.), was placed in proximate contact with the layer of imageable material. The layer of imageable material was then imaged through the carrier sheet on a DESERTCAT 88 imager using 830 nm radiation at 400 mJ using the vacuum hold-down. The approval intermediate receptor sheet received the exposed imageable material from the carrier sheet. The imageable material on the approval intermediate receptor sheet was then laminated onto a FLEXCEL-SRH flexographic precursor available from Kodak Polychrome Graphics (Norwalk, Conn.) using a KODAK model 800XL APPROVAL LAMINATOR. The reverse image remaining on the carrier sheet was also laminated to another FLEXCEL-SRH flexographic precursor available from Kodak Polychrome Graphics (Norwalk, Conn.) using a KODAK model 800XL APPROVAL LAMINATOR.

Example 12

A first flexographic printing plate was made by the following process. An imaged film was made, laminated to a FLEXCEL-SRH flexographic precursor, available from Kodak Polychrome Graphics (Norwalk, Conn.), exposed to UV radiation and developed all in the manner described in Example 7. The resulting relief image on the flexographic plate had a height of 23 mil.

A second flexographic printing plate was made by a known integral mask method. A commercially available sample of DuPont CDI digital flexographic material, available from DuPont (Wilmington, Del.), was laser exposed to 3.3 J/cm$^2$ of 830 nm radiation on the DESERTCAT 88 imager then exposed to UV radiation and developed as described in Example 7. The resulting relief image on the flexographic plate had a height of 23 mil.

The first flexographic plate was then mounted on the plate cylinder of a Mark Andy 2200F narrow-width flexographic press, available from Mark Andy, Inc. (St. Louis, Mo.) and used to process UV process black ink, available from Akzo Nobel, Inc. (Chicago, Ill.) onto 10 inch wide Westvaco #2 paper. The second flexographic plate was used in the same manner as the first flexographic plate to print images using the same type of paper, ink and using the same flexographic press. The printed images produced by the first and second flexographic plates were compared.

The spatial resolution in printed images from a flexographic plate produced by the first flexographic plate was measurably better than that of images printed from the second flexographic plate produced by the integral mask method. FIG. 12A, for example, shows a measured line width of 56 micrometers for a lower-case L in four-point Helvetica type printed by first flexographic plate while FIG. 12B shows a measured line width of 78 micrometers for a lower-case L in four-point Helvetica type printed by the second flexographic plate.

The invention claimed is:
1. A method of making a relief image, the method comprising:
(a) providing a film comprising an imageable material disposed on a carrier sheet;
(b) contacting the imageable material with a receptor sheet;
(c) forming a mask image on the receptor sheet by imagewise exposing the imageable material to infrared radiation to form exposed areas and transferring the exposed areas of the imageable material to the receptor sheet;
(d) removing the carrier sheet from the mask image;
(e) transferring the mask image to a photosensitive material that is sensitive to a curing radiation;

(f) exposing the photosensitive material to the curing radiation through the mask image to form an imaged article, wherein the mask image is substantially opaque to the curing radiation; and (g) developing the imaged article to form the relief image.

2. The method of claim 1 wherein the receptor sheet comprises a support having an image-receiving side and a non-image side, the image-receiving side comprises a polymer coating having a thickness of from 2 μm to 20 μm.

3. The method of claim 1 wherein the receptor sheet comprises a support having an image-receiving side and a non-image side, the image-receiving side having a texturized surface.

4. The method of claim 3 wherein the image-receiving side has a texturized surface provided by inert particulate material at a coverage of from 100 to 500 particles/mm$^2$.

5. The method of claim 1 wherein the step of forming the mask image on the receptor sheet comprises subliming a colorant in exposed areas to the receptor sheet.

6. The method of claim 1 wherein the step of forming the mask image on the receptor sheet comprises ablating the exposed areas to the receptor sheet.

7. The method of claim 1 wherein the step of forming the mask image on the receptor sheet comprises melt-stick or laser-induced film transfer of the exposed areas of the imageable material to the receptor sheet.

8. The method of claim 1 further comprising the step of removing the receptor sheet from the mask image.

9. The method of claim 8 wherein the step of removing the receptor sheet from the mask image occurs before the step of exposing the photosensitive material to the curing radiation.

10. The method of claim 8 wherein the step of removing the receptor sheet from the mask image occurs after the step of exposing the photosensitive material to the curing radiation.

11. The method of claim 1 wherein the film further comprises a release layer disposed between the carrier sheet and the imageable material.

12. The method of claim 1 wherein the film further comprises a barrier layer disposed between the carrier sheet and the imageable material.

13. The method of claim 12 wherein the barrier layer comprises poly(cyanoacrylate alkyl) or nitrocellulose, and an infrared absorbing dye.

14. The method of claim 1 wherein the imageable material comprises an infrared absorber.

15. The method of claim 1 wherein the imageable material comprises an ultraviolet absorber.

16. The method of claim 1 wherein the imageable material comprises a colorant.

17. The method of claim 1 wherein the imageable material comprises an adhesive binder.

18. The method of claim 1 wherein the step of removing the carrier sheet from the mask image occurs before the step of exposing the photosensitive material to the curing radiation.

19. The method of claim 1 wherein the step of removing the carrier sheet from the mask image occurs after the step of exposing the photosensitive material to the curing radiation.

20. The method of claim 1 for providing a flexographic printing plate wherein the photosensitive material comprises a flexographic precursor that comprises an ultraviolet-curable material.

21. The method of claim 1 wherein the curing radiation comprises ultraviolet radiation.

22. The method of claim 1 wherein the step of transferring the mask image to the photosensitive material comprises laminating the mask image to the photosensitive material.

23. The method of claim 1 wherein the step of exposing the photosensitive material to the curing radiation is performed in ambient pressure, with or without heat.

* * * * *